(12) United States Patent
Hsieh et al.

(10) Patent No.: US 11,776,863 B2
(45) Date of Patent: Oct. 3, 2023

(54) SEMICONDUCTOR DEVICE PACKAGE

(71) Applicant: Advanced Semiconductor Engineering, Inc., Kaohsiung (TW)

(72) Inventors: Hao-Chih Hsieh, Kaohsiung (TW); Tun-Ching Pi, Kaohsiung (TW); Sung-Hung Chiang, Kaohsiung (TW); Yu-Chang Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/404,912

(22) Filed: Aug. 17, 2021

(65) Prior Publication Data

US 2021/0375706 A1  Dec. 2, 2021

Related U.S. Application Data

(63) Continuation of application No. 16/537,371, filed on Aug. 9, 2019, now Pat. No. 11,094,602.

(51) Int. Cl.
*H01L 23/13* (2006.01)
*H01L 23/14* (2006.01)
*H01L 23/498* (2006.01)
*H01L 23/40* (2006.01)

(52) U.S. Cl.
CPC ............ *H01L 23/13* (2013.01); *H01L 23/147* (2013.01); *H01L 23/49822* (2013.01); *H01L 23/49827* (2013.01); *H01L 2023/4087* (2013.01)

(58) Field of Classification Search
CPC . H01L 23/13; H01L 23/147; H01L 23/49822; H01L 23/49827; H01L 2023/4087; H01L 23/498–49894; H01L 23/538–5389; H01L 23/5383; H01L 23/49833; H01L 23/5385; H01L 23/5384; H01L 2224/08165; H01L 2224/16165; H01L 2224/16235; H01L 21/56; H01L 23/3121; H01L 21/568; H01L 23/49816; H01L 2224/16225; H01L 2224/97; H01L 23/28–3192
See application file for complete search history.

(56) References Cited

U.S. PATENT DOCUMENTS

| | | | |
|---|---|---|---|
| 7,829,992 B2 | 11/2010 | Sugino et al. | |
| 7,872,343 B1 | 1/2011 | Berry | |
| 2010/0244212 A1* | 9/2010 | Ha | H01L 25/03 257/676 |
| 2015/0287672 A1 | 10/2015 | Yazdani | |
| 2018/0277394 A1* | 9/2018 | Huemoeller | H01L 23/5389 |
| 2020/0132953 A1* | 4/2020 | Rosenberg | G02B 6/4269 |

(Continued)

OTHER PUBLICATIONS

Non-Final Office Action for U.S. Appl. No. 16/537,371, dated Nov. 24, 2020, 16 pages.

(Continued)

*Primary Examiner* — Shahed Ahmed
(74) *Attorney, Agent, or Firm* — FOLEY & LARDNER LLP

(57) ABSTRACT

A semiconductor device package includes a carrier, a first interposer disposed and a second interposer. The second interposer is stacked on the first interposer, and the first interposer is mounted to the carrier. The combination of the first interposer and the second interposer is substantially T-shaped.

9 Claims, 36 Drawing Sheets

(56) References Cited

U.S. PATENT DOCUMENTS

2020/0168550 A1* 5/2020 Ryu .................... H01L 25/0652
2020/0294917 A1* 9/2020 Lee ........................ H01L 25/18
2020/0312770 A1* 10/2020 Lu ......................... H01L 25/105
2020/0312826 A1* 10/2020 Jung ................... H01L 23/5384

OTHER PUBLICATIONS

Notice of Allowance for U.S. Appl. No. 16/537,371, dated Apr. 14, 2021, 8 pages.

* cited by examiner

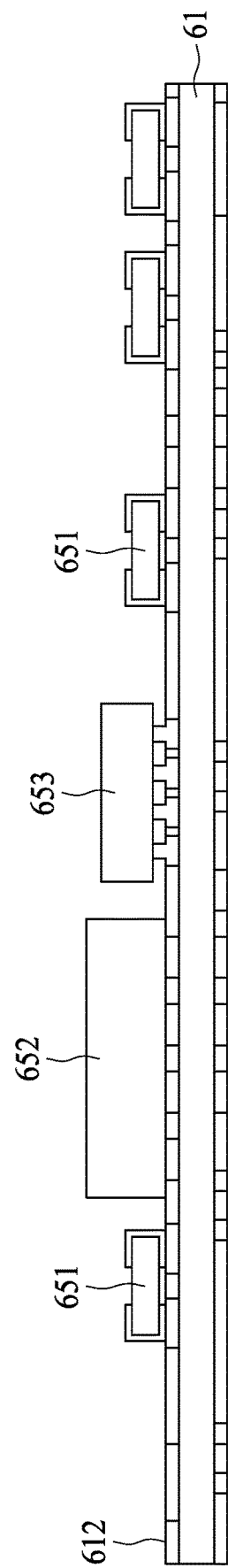

SEMICONDUCTOR DEVICE PACKAGE

CROSS-REFERENCE TO RELATED APPLICATION

This application is a continuation of U.S. patent application Ser. No. 16/537,371 filed Aug. 9, 2019, the contents of which is incorporated herein by reference in its entirety.

BACKGROUND

1. Technical Field

The instant disclosure relates to a semiconductor device package, especially a semiconductor device package having two stacked interposers.

2. Description of Related Art

To address a trend towards smaller sizes, a semiconductor package should effectively utilize its package size such that the component could be packaged as many as possible. An interposer is used as an interconnection between two carriers. However, a comparative interposer will occupy a lot of space of the semiconductor package such that the amount of the component which could be packaged in the semiconductor package will be reduced.

SUMMARY

According to one example embodiment of the instant disclosure, a semiconductor device package comprises a carrier having a first surface, a first interposer disposed on the first surface of the carrier, and a second interposer stacked on the first interposer. The second interposer has a second surface facing the first surface of the carrier and a third surface opposite to the second surface. The second interposer comprises a plurality of first pads adjacent to the second surface and a plurality of second pads adjacent to the third surface. Further, a pitch between two adjacent second pads is greater than a pitch between two adjacent first pads.

According to another example embodiment of the instant disclosure, a semiconductor device package comprises a carrier having a first surface, a first interposer disposed on the first surface of the carrier, and a second interposer stacked on the first interposer. Especially, one second interposer is selectively stacked on the one first interposer. Further, a cross-sectional width of the second interposer is smaller than a cross-sectional width of the carrier.

In order to further understand the instant disclosure, the following embodiments are provided along with illustrations to facilitate appreciation of the instant disclosure; however, the appended drawings are merely provided for reference and illustration, without any intention to limit the scope of the instant disclosure.

BRIEF DESCRIPTION OF THE DRAWINGS

FIG. 6A, FIG. 6B, FIG. 6C, FIG. 6D, FIG. 6E, FIG. 6F and FIG. 6G show a method of manufacturing a semiconductor device package in accordance with another embodiment of the instant disclosure.

DETAILED DESCRIPTION

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated by such arrangement.

Figure 1A:
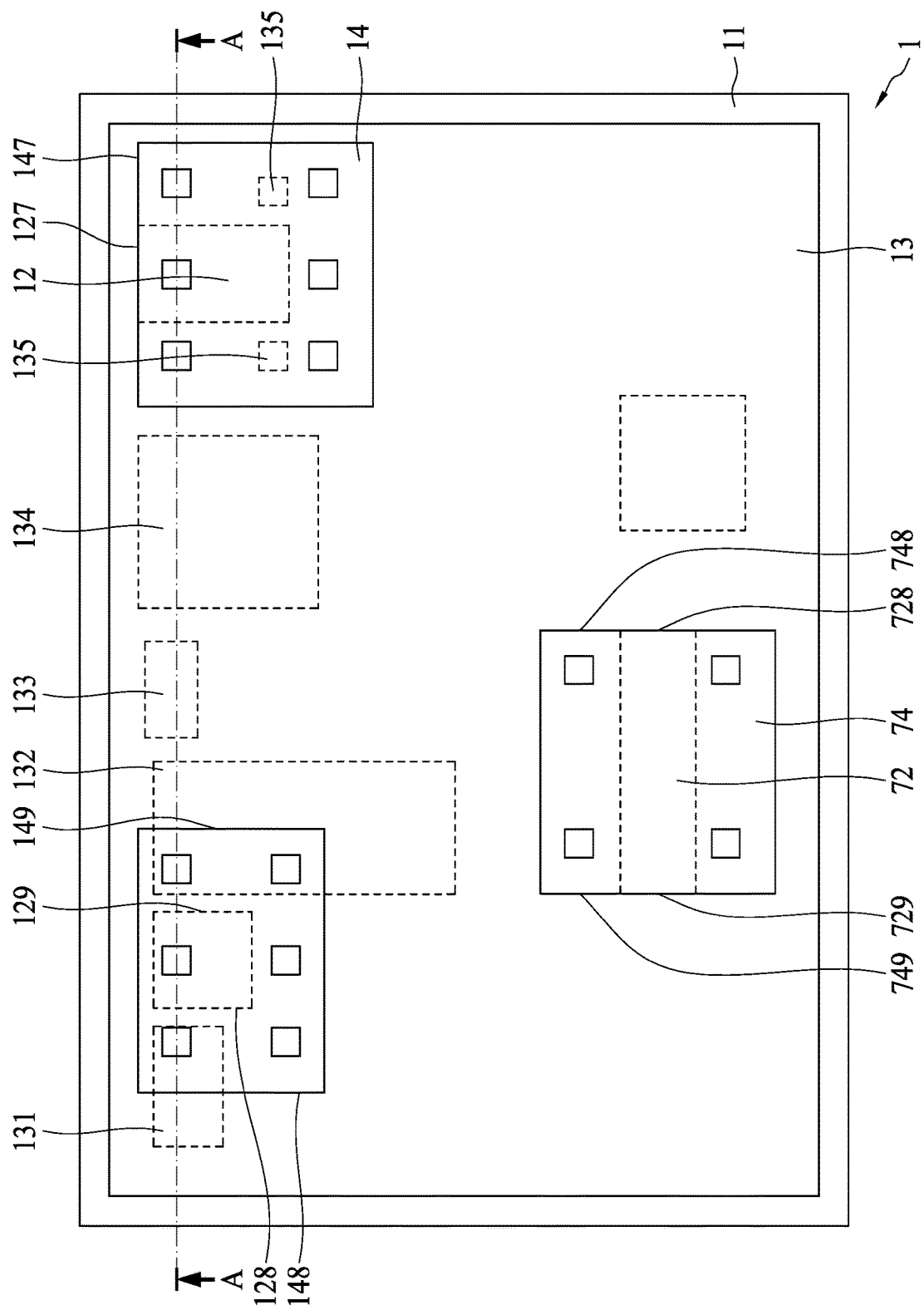
FIG. 1A is a top view of a semiconductor device package in accordance with an embodiment of the instant disclosure.

FIG. 1A shows a top view of a semiconductor device package 1 in accordance with an embodiment of the instant disclosure. With reference to FIG. 1A, the semiconductor device package 1 may comprise a carrier 11. The carrier 11 may be, for example, a printed circuit board, such as a paper-based copper foil laminate, a composite copper foil laminate, or a polymer-impregnated glass-fiber-based copper foil laminate. In some embodiments, the carrier 11 may be a single-layer substrate or multi-layer substrate. There are several components 131, 132, 133, 134 and 135 mounted on the carrier 11. Further, several lower interposers 12 may be mounted on the carrier 11, and several upper interposers 14 may be respectively stacked on the lower interposers 12. Especially, one upper interposer 14 may be selectively stacked on a single one lower interposer 12. A material of the lower interposers 12 and the upper interposers 14 may be the same with the carrier 11. An upper encapsulating material 13 may be disposed on the carrier 11 and may cover the carrier 11, the components 131, 132, 133, 134 and 135, the lower interposers 12 and the upper interposers 14. The pads 145 of the upper interposers are exposed. The encapsulating material includes an epoxy resin including fillers, a molding compound (e.g., an epoxy molding compound or other molding compound), a polyimide, a phenolic compound or material, a material including a silicone dispersed therein, or a combination thereof.

Figure 1B:
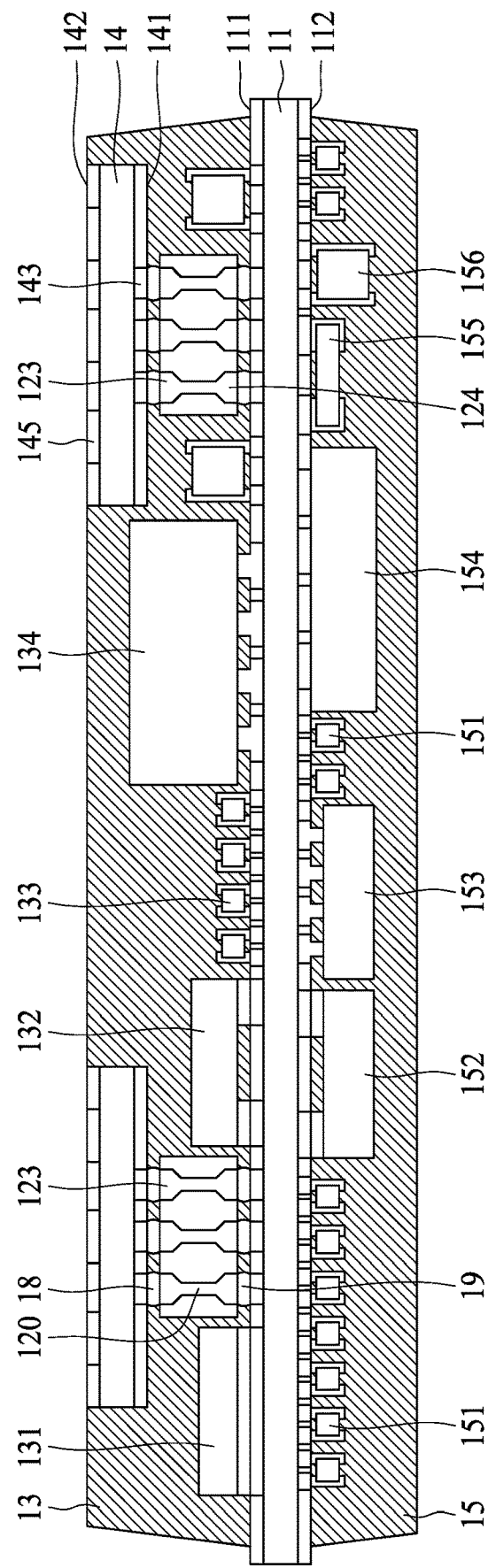
FIG. 1B illustrates a cross-sectional view along line I-I in FIG. 1A.

FIG. 1B illustrates a cross-sectional view along line I-I in FIG. 1A. With reference to FIG. 1B, the semiconductor device package 1 may comprise a carrier 11 and the components 131, 132, 133, 134, 135 and 136 may be mounted on an upper surface 111 of the carrier 11. The lower interposers 12 may be mounted the upper surface 111 of the carrier, and the upper interposers 14 may be stacked on the lower interposers 12 respectively. The upper encapsulating material 13 may be disposed on the upper surface 111 of the carrier 11 and may cover the upper surface 111 of the carrier 11, the components 131, 132, 133,134, 135 and 136, the lower interposers 12 and the lateral surfaces 148, 149 of the upper interposers 14. Referring to FIG. 1B, a cross-sectional width of the upper interposer 14 may be greater than a cross-sectional width of the lower interposer 12. That is, the upper interposer 14 may have two opposite lateral surfaces 148 and 149 and the lower interposer 12 may have two opposite lateral surfaces 128 and 129. A distance between the lateral surfaces 148 and 149 of the upper interposer 14 is greater than a distance between the lateral surfaces 128 and 129 of the lower interposer 12. In addition, the cross-sectional width of the upper interposer 14 may be smaller than the cross-sectional width of the carrier 11. Moreover, the lower interposer 12 may comprise a conductive via 120 having a sandglass-shaped cross-section.

In addition, the lower interposers 12 may hay a lateral surface 127, which may be substantially align with a lateral surface 147 of the upper interposer 14. Further, the lower interposer 72 may have two opposite lateral surfaces 728, 729, and the upper interposer may have two opposite lateral surfaces 748, 749. The lateral surfaces 728 and 729 of the lower interposer 72 may respectively align with the lateral surfaces 748, 749 of the upper interposer 74.

The upper interposer 14 may have a lower surface 141 facing the upper surface 111 of the carrier 11 and an upper surface 142 opposite to the lower surface 141. Several pads 143 may be substantially formed at the lower portion of the upper interposer 14 and adjacent to the lower surface 141. Several pads 145 may be substantially formed at the upper portion of the upper interposer 14 and adjacent to the upper surface 142. A pitch between two adjacent pads 145 may be 0.6 mm and a pitch between two adjacent pads 143 may be 0.35 mm. Thus, the pitch between two adjacent pads 145 may be greater than the pitch between two adjacent pads 143. That is, a density of the distribution of the pads 143 is greater than a density of the distribution of the pads 145. Thus, the pads 145 of the upper interposers may be used to connect another component which has the larger connector. Further, the upper interposers 14 may comprise a redistribution layer and thus the pads 143 and the pads 145 may be electrically connected to each other. The lower interposer 12 may have an upper surface 121 facing the lower surface 141 of the second interposer 14 and a lower surface 122 facing the upper surface 111 of the carrier 11. Several pads 123 may be substantially formed at the upper portion of the lower interposer 12 and adjacent to the upper surface 121. A pitch between two adjacent pads 123 of the lower interposer 12 may be substantially equal to the pitch between two adjacent pads 143 of the upper interposer 14. Thus, the pads 123 of the lower interposer 12 may connect to the pads 143 of the upper interposer 14 when the upper interposer 14 is stacked on the lower interposer 12. As shown in FIG. 1B, the pads 123 of the lower interposer 12 may connect to the pads 143 of the upper interposer 14 by the solder balls 18. Moreover, several pads 124 may be substantially formed at the lower portion of the lower interposer 12 and adjacent to the lower surface 122. Several pads 115 may be formed adjacent to the upper surface 111 of the carrier 11. A pitch between two adjacent pads 124 of the lower interposer 12 may be substantially equal to the pitch between two adjacent pads 115 of the carrier 11. Thus, the pads 124 of the lower interposer 12 may connect to the pads 115 of the carrier 11 when the upper interposer 14 is mounted to the carrier 11. As shown in FIG. 1B, the pads 124 of the lower interposer 12 may connect to the pads 115 of the carrier 11 by the solder balls 19. In addition, the lower interposer 12 may also comprises a redistribution layer. Thus, the pitch between two adjacent pads 123 may be different from the pitch between two adjacent pads 124.

Referring to FIG. 1B, the combination of the lower interposer 12 and the upper interposer 14 may be substantially T-shaped. Thus, there may be a space between the lower interposer 12 and the upper interposer 14. That is, there may be a space underneath the upper interposer 14, which can receive a component or a portion of a component. Thus, a component or a portion of a component could be arranged in the space and/or underneath the upper interposer 14. Therefore, the semiconductor device package 1 could have more space to contain more components. As shown in FIG. 1B, a portion of the component 131 and a portion of the component 132 may be arranged underneath the upper interposer 14. The components 135 and 136 may be totally arranged underneath the upper interposer 14. In addition, the component 134, whose height is greater than the height of the lower interposer 12, cannot arranged underneath the lower interposer 14.

In addition, the carrier may comprise a lower surface 112 which is opposite to the upper surface 111. There are several components 151, 152, 153, 154, 155 and 156 mounted on the lower surface 112 of the carrier 11. A lower encapsulating material 15 may be disposed on the lower surface 112 of the carrier 11 and may cover the lower surface 112 of the carrier 11 and the components 151, 152, 153, 154, 155 and 156.

FIG. 2A, FIG. 2B, FIG. 2C, FIG. 2D, FIG. 2E, FIG. 2F, FIG. 2G and FIG. 2H show a method of manufacturing the upper interposer 24 and the lower interposer 22 in accordance with an embodiment of the instant disclosure.

Figure 2A:
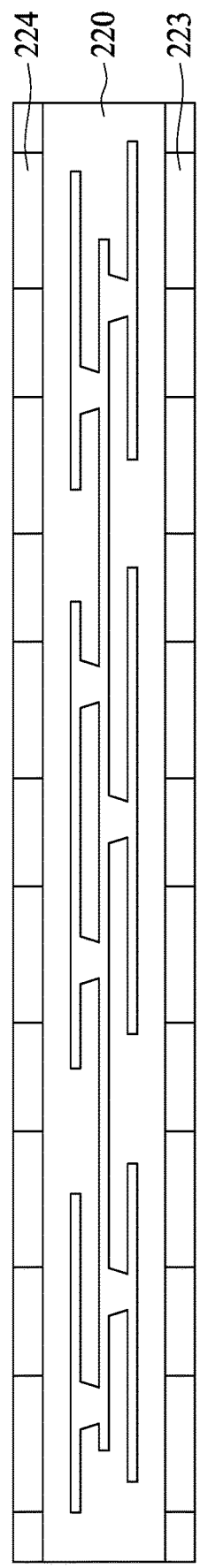
FIG. 2A, FIG. 2B, FIG. 2C, and FIG. 2D, FIG. 2E, FIG. 2F and FIG. 2G show a method of manufacturing two interposers in accordance with an embodiment of the instant disclosure.

Referring to FIG. 2A, a substrate 220 may comprise a plurality of pads 223 and 224. The substrate 220 may comprise the redistribution layer, and thus the pads 223 and 224 may electrically connect to each other. That is, a pitch between two adjacent pads 223 may be different from a pitch between two adjacent pads 224.

Figure 2B:
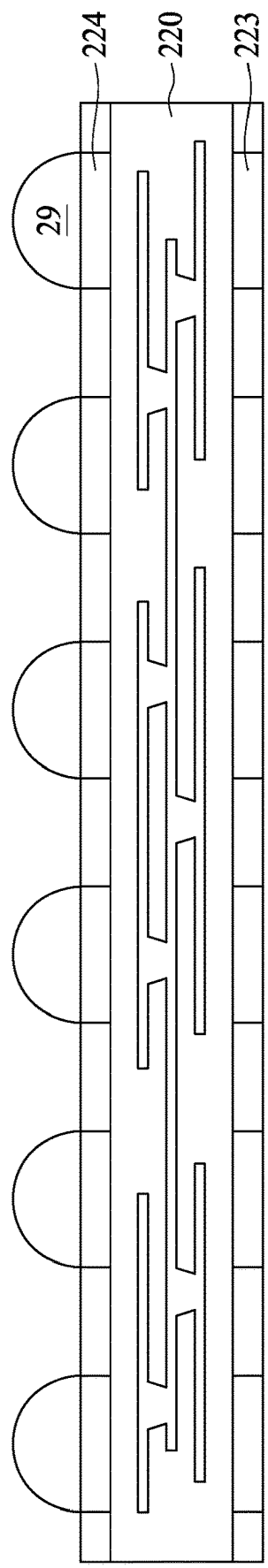

Referring to FIG. 2B, the solder balls 29 may be respectively disposed on the pads 224 of the substrate 220.

Figure 2C:
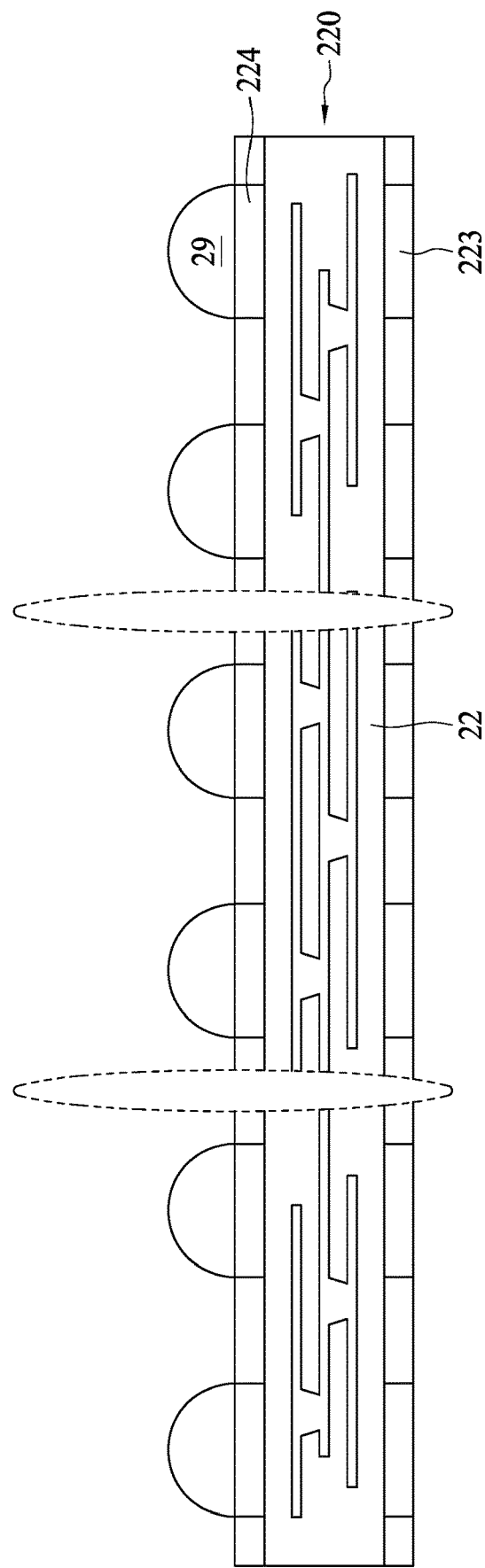

Referring to FIG. 2C, the substrate 220 may be cut into many sections by sawing methods. One of the sections will be used as the lower interposer 22.

Figure 2D:
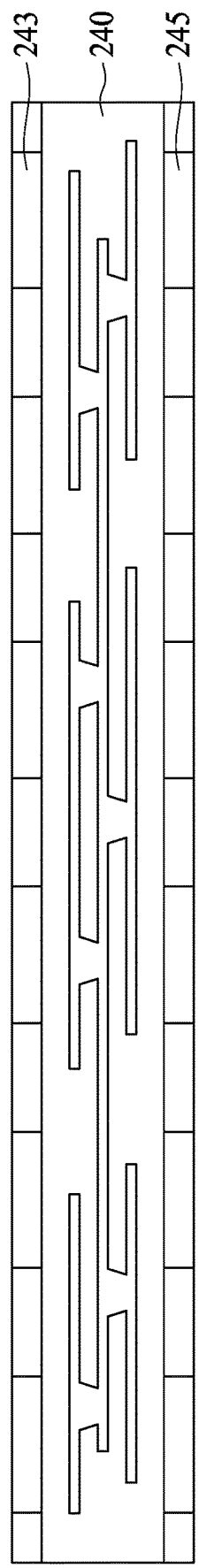

Referring to FIG. 2D, a substrate 240 may comprise a plurality of pads 243 and 245. The substrate 240 may comprise the redistribution layer, and thus the pads 243 and 245 may electrically connect to each other. That is, a pitch between two adjacent pads 245 may be different from a pitch between two adjacent pads 243. In particular, the pitch between two adjacent pads 245 may be greater than the pitch between two adjacent pads 243.

Figure 2E:
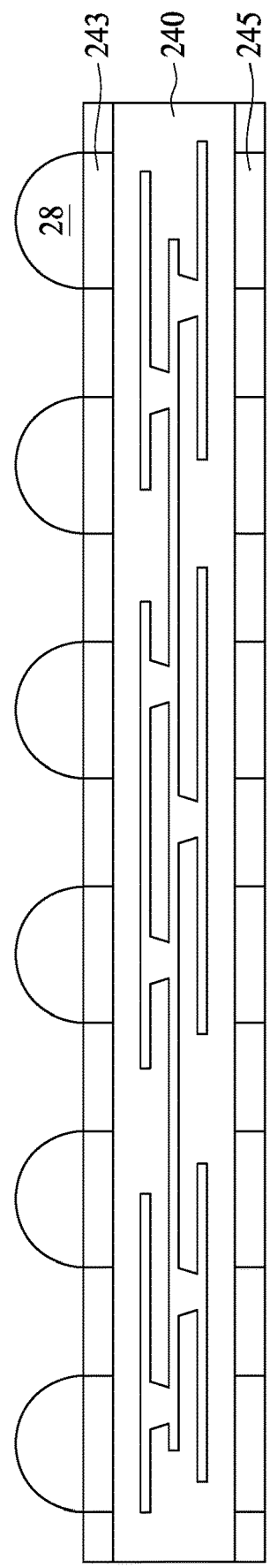

Referring to FIG. 2E, the solder balls 28 may be respectively disposed on the pads 243 of the substrate 240.

Figure 2F:
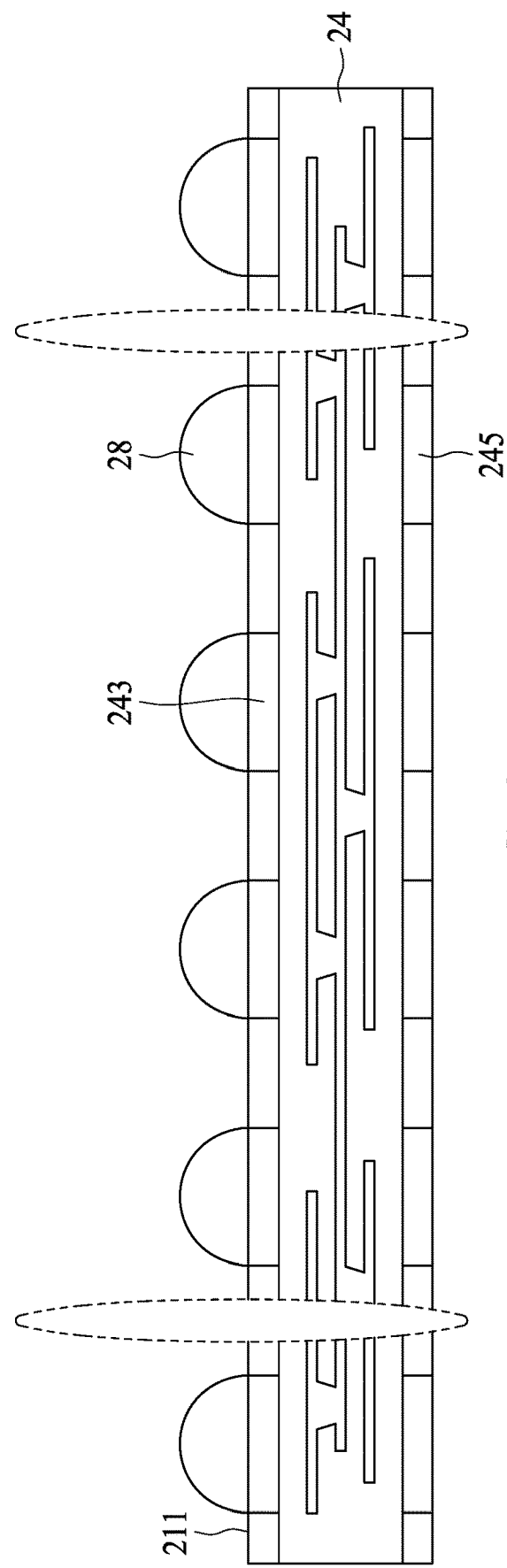

Referring to FIG. 2F, the substrate 240 may be cut into many sections by sawing methods. One of the sections will be used as the upper interposer 24.

Figure 2G:
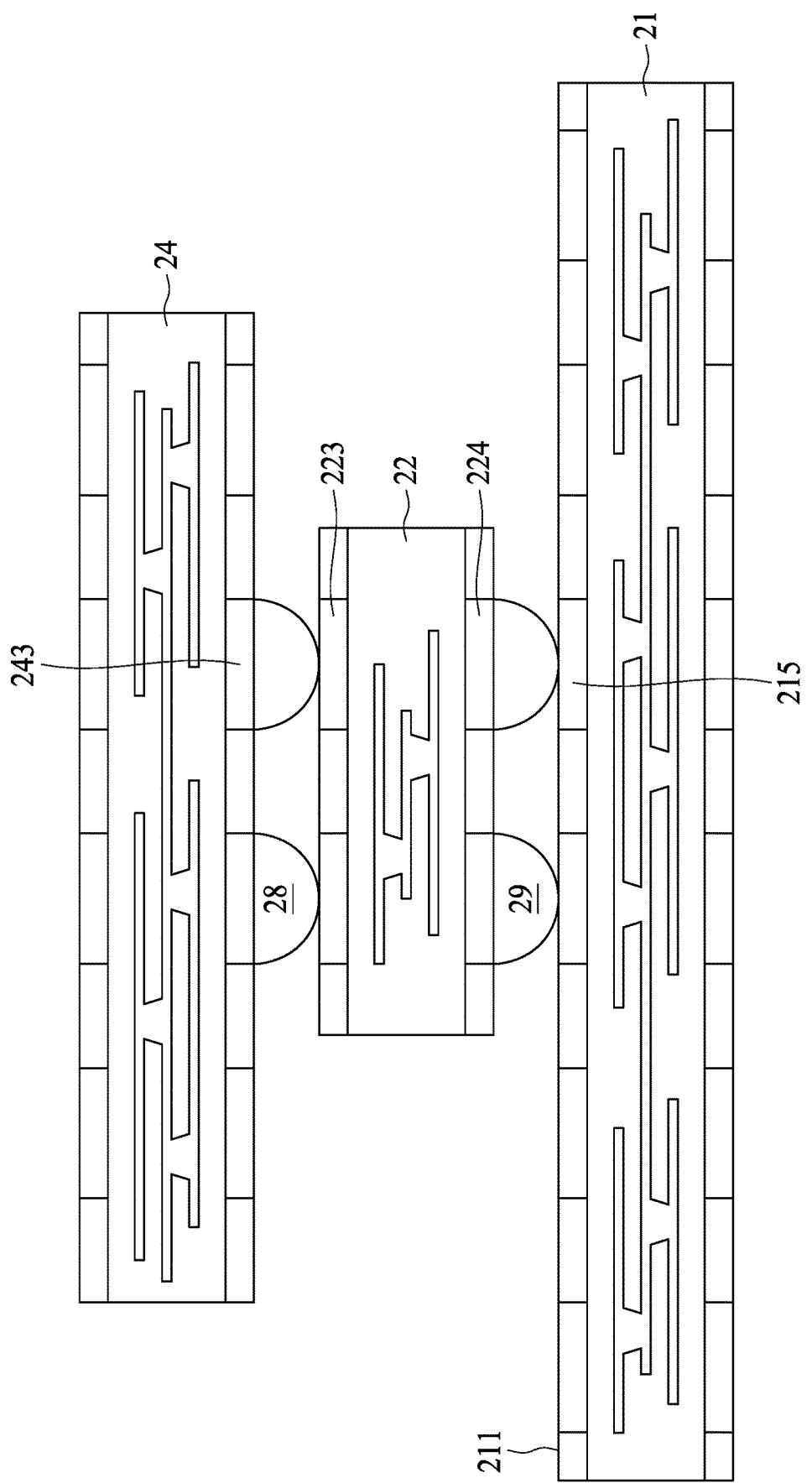

Referring to FIG. 2G, the lower interposer 22 may be disposed on the upper surface 211 of the carrier 21. The solder balls 29 may be connected to the pads 215 of the carrier 21. The upper interposer 24 may be stacked on the lower interposer 22 by the flux dipping process. The solder balls 28 may be connected to the pad 223 of the lower interposer 22. After the lower interposer 22 have been disposed on the carrier 21 and the upper interposer 24 have been stacked on the lower interposer 22, the carrier 21, the lower interposer 22 and the upper interposer 24 may be cured (e.g., heating or reflowing process) such that the lower interposer 22 and the upper interposer 24 could be mounted to the carrier 21. In addition, the height of the lower interposer 22 may be 0.62 mm and the height of the upper interposer 24 may be 0.16 mm. Further, the cross-sectional width of the upper interposer 24 may be greater than the cross-sectional width of the lower interposer 22. Therefore, the combination of the lower interposer 22 and the upper interposer 24 may be substantially T-shaped. In addition, the cross-sectional width of the upper interposer 24 may be smaller than the cross-sectional width of the carrier 21.

FIG. 3A, FIG. 3B, FIG. 3C, FIG. 3D, FIG. 3E, FIG. 3F, FIG. 3G and FIG. 3H show a method of manufacturing a semiconductor device package 3 in accordance with another embodiment of the instant disclosure.

Figure 3A:
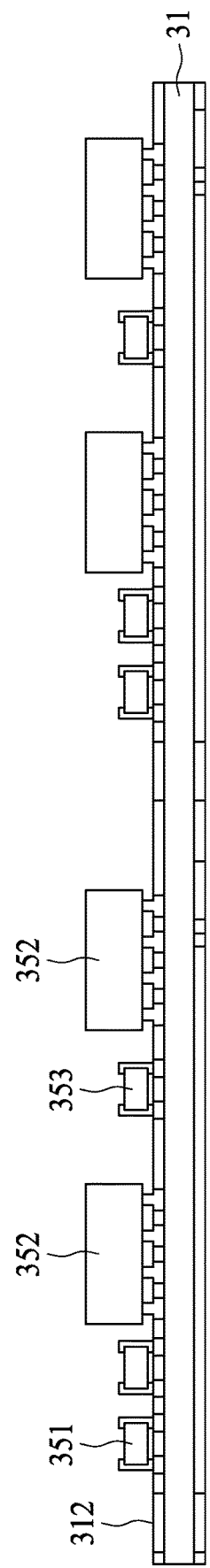
FIG. 3A, FIG. 3B, FIG. 3C, FIG. 3D, FIG. 3E, FIG. 3F, FIG. 3G and FIG. 3H show a method of manufacturing a semiconductor device package in accordance with another embodiment of the instant disclosure.

Referring to FIG. 3A, the components 351, 352 and 353 may be disposed on the surface 312 of the substrate 310. Especially, the components 351, 352 and 353 may be mounted to the substrate 210 by SMT (Surface Mount Technology) process.

Figure 3B:
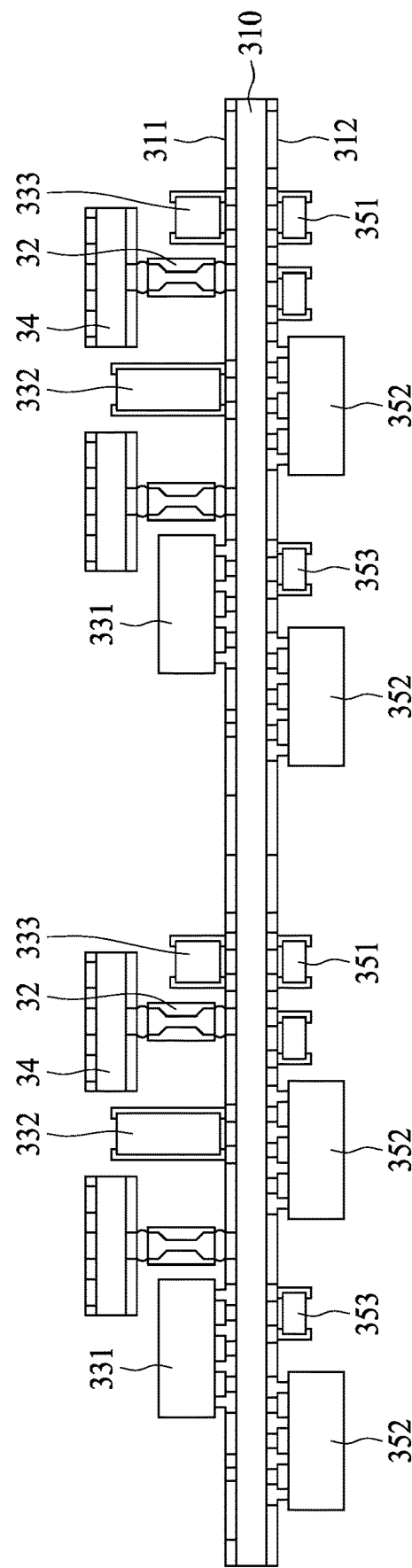

Referring to FIG. 3B, the substrate 310 may be turned upside down. Then, the components 331, 332 and 333 may be disposed on the surface 311 of the substrate 310. The upper interposers 34 may be respectively stacked on the lower interposers 32 and the lower interposers 32 may be disposed on the surface 311 of the substrate 310. Especially, the components 331, 332 and 333 and the lower interposer 32 may be mounted to the substrate 310 by SMT process. Further, as shown in FIG. 3B, one upper interposer 34 may be selectively stacked on a single one lower interposer 32, and a cross-sectional width of the upper interposer 34 may be greater than a cross-sectional width of the lower interposer 32. Thus, the combination of the lower interposer 32 and the upper interposer 34 may be substantially T-shaped. In addition, the components 331 and 333 are partially arranged underneath the upper interposer 34. Moreover, the cross-sectional width of the upper interposer 34 may be smaller than the cross-sectional width of the carrier 31.

Figure 3C:
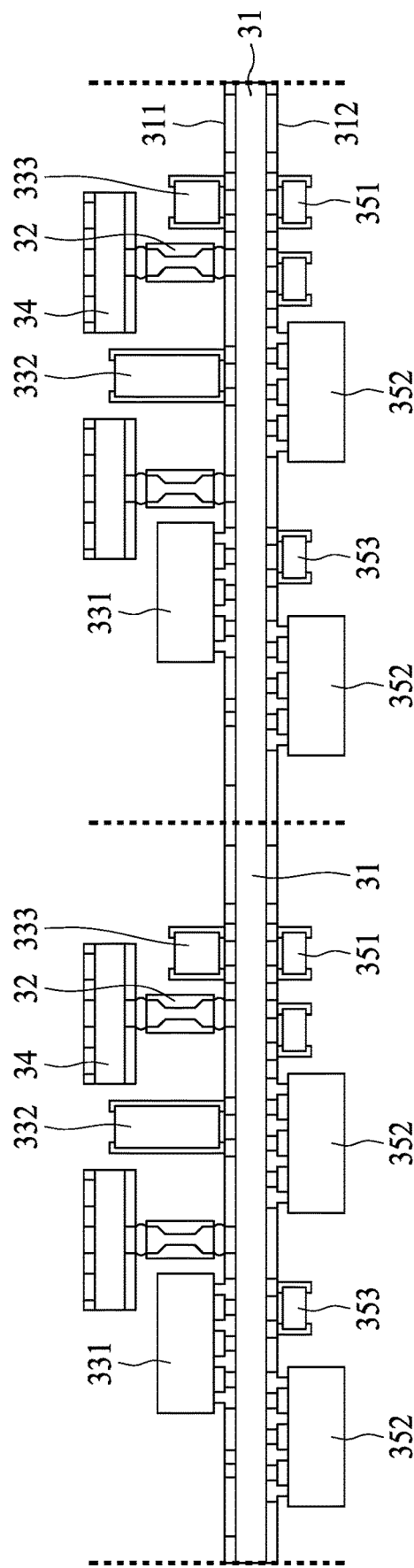

Referring to FIG. 3C, a cutting machine (not shown) cuts the substrate 310 to form two individual carriers 31.

Figure 3D:
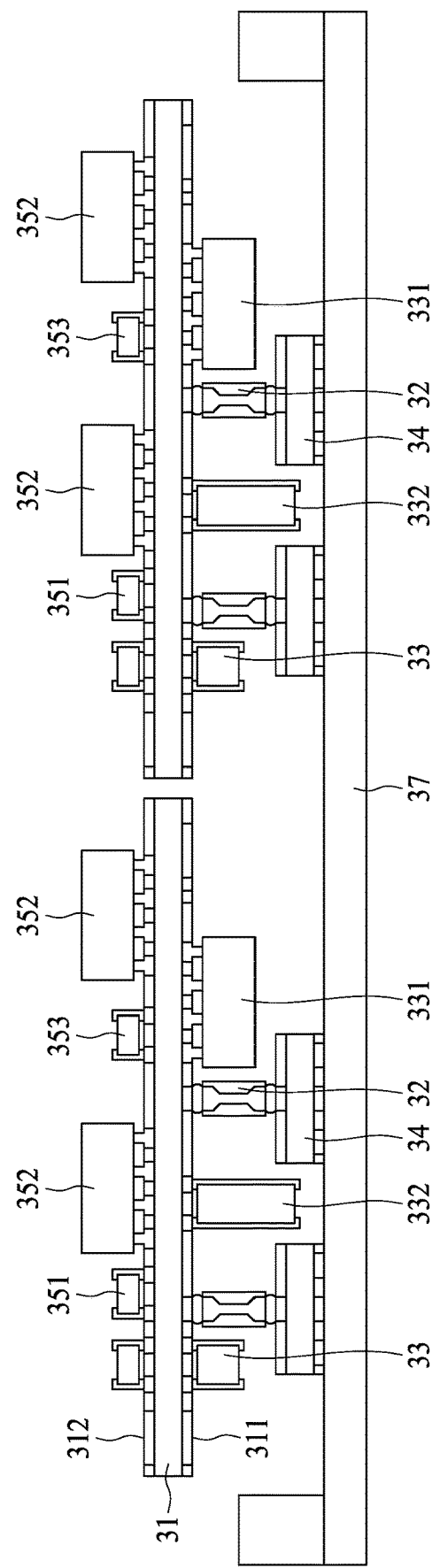

Referring to FIG. 3D, the carriers 31 may be turned upside down and arranged on a tape 37 such that the surfaces 342 of the upper interposers 34 may be attached to the tape 37.

Figure 3E:
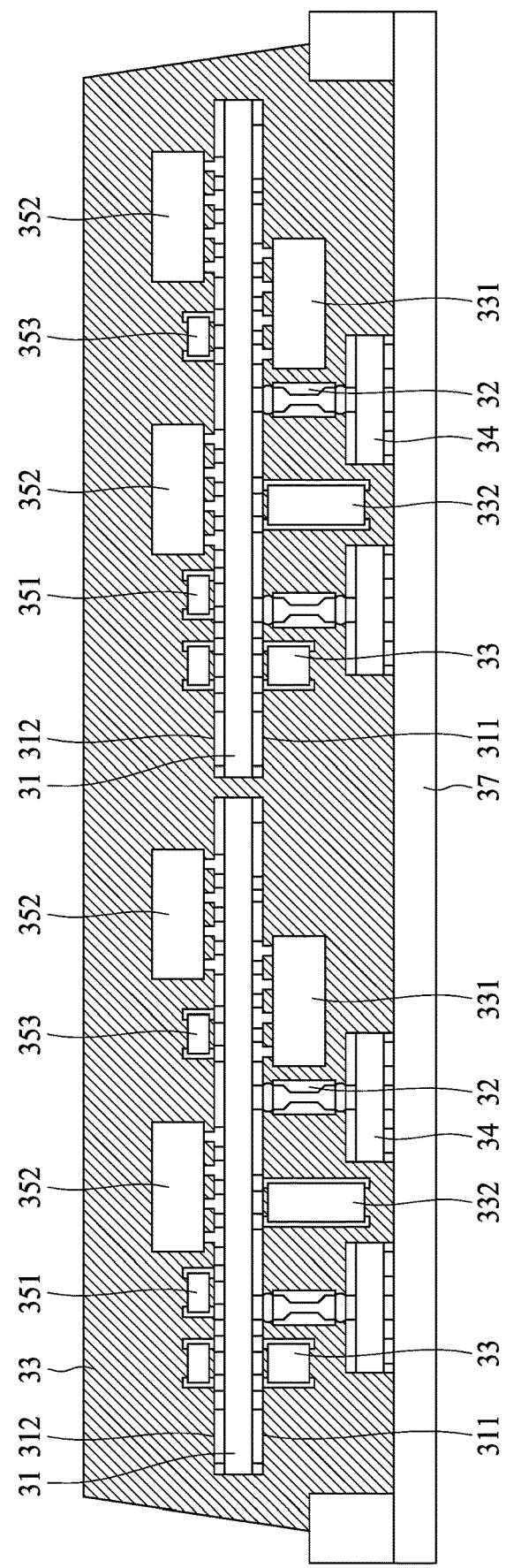

Referring to FIG. 3E, an encapsulating material 33 may be formed to encapsulate the whole carriers 31, the components 331, 332, 333, 351, 352, 353, the lower interposers 32 and the lateral side surfaces of the upper interposers 34. Since the surface 342 of the upper interposers 34 is attached to the tape 37, the surface 342 may be not encapsulated by the encapsulating material 33. In addition, since the encapsulating material 33 encapsulates the whole carriers 31, the lateral surfaces of the carriers 31 may be covered by the encapsulating material 33.

Figure 3F:
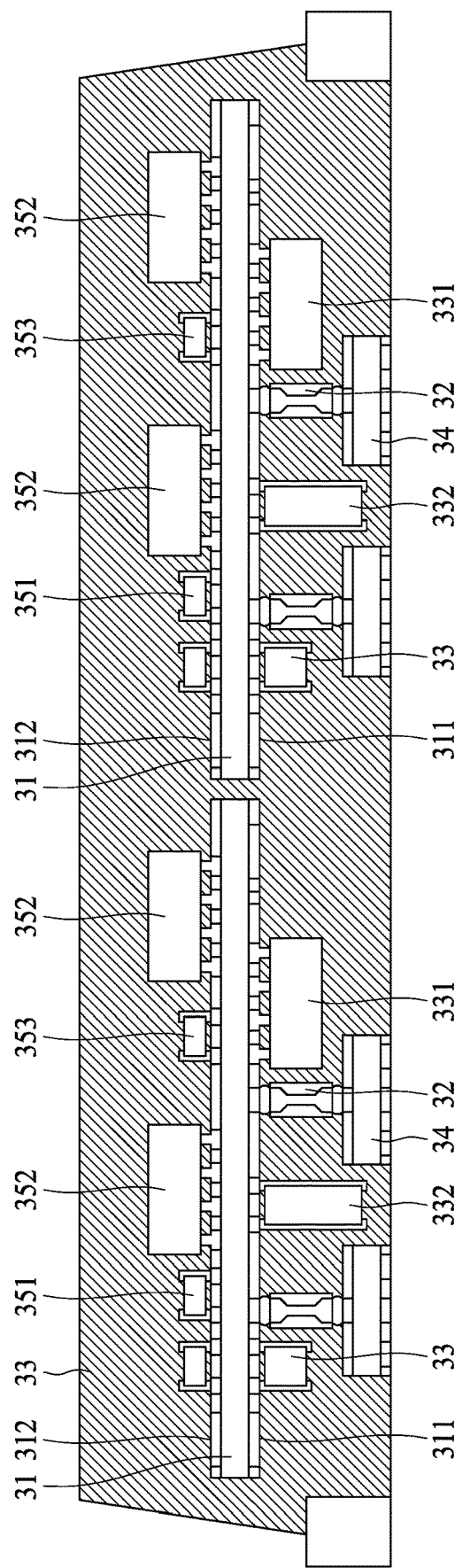

Referring to FIG. 3F, the tape 37 is removed from the surfaces 342 of the upper interposers 34, and the surfaces 342 of the upper interposers 34 are exposed.

Figure 3G:
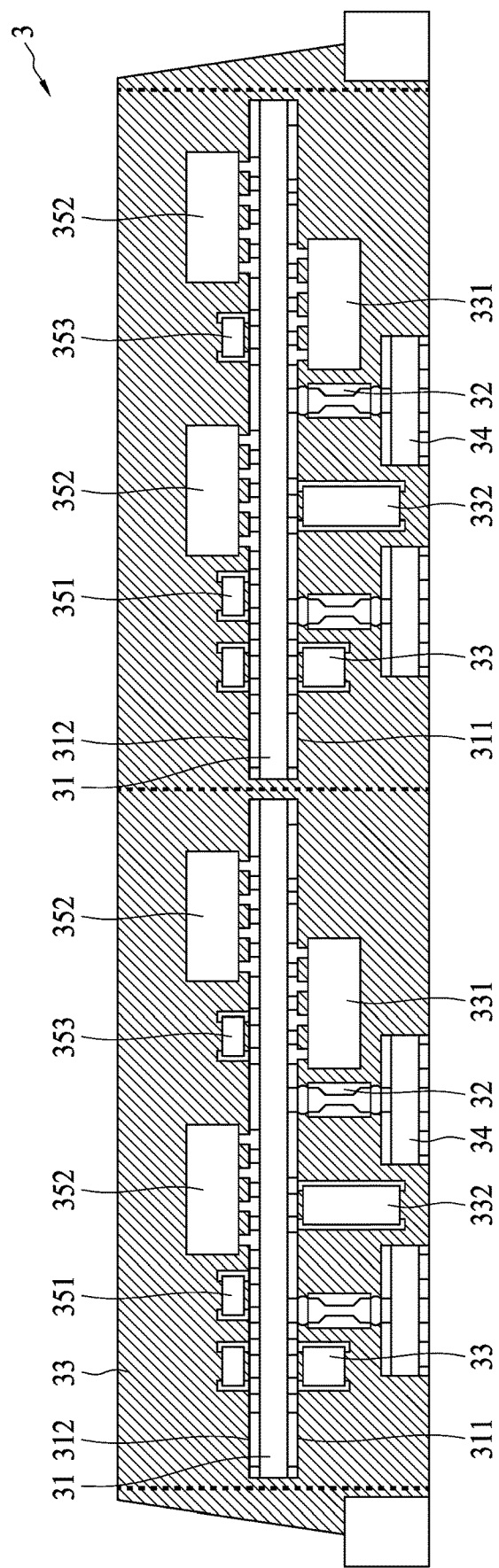

Referring to FIG. 3G, a cutting machine (not shown) cuts the encapsulating material 33. Thereby, the semiconductor device packages 3 are formed, as illustrated in FIG. 3H.

Figure 3H:
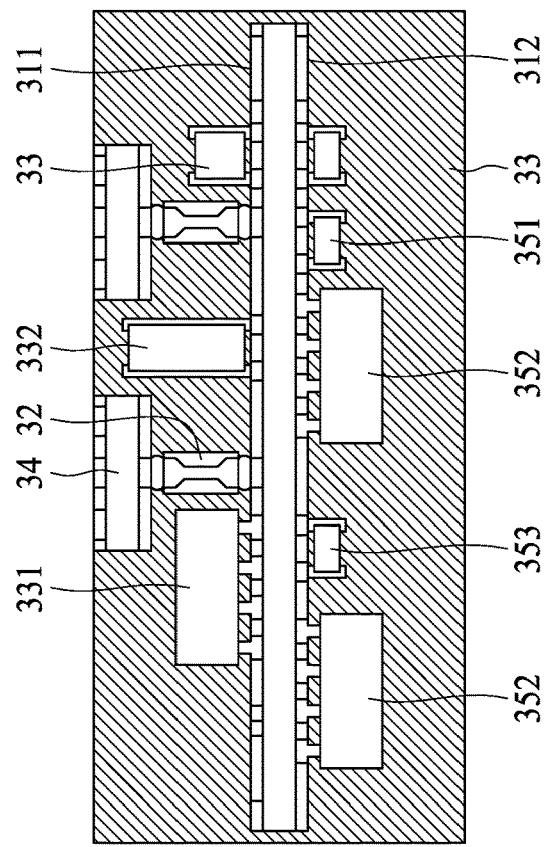
Figure 3H:
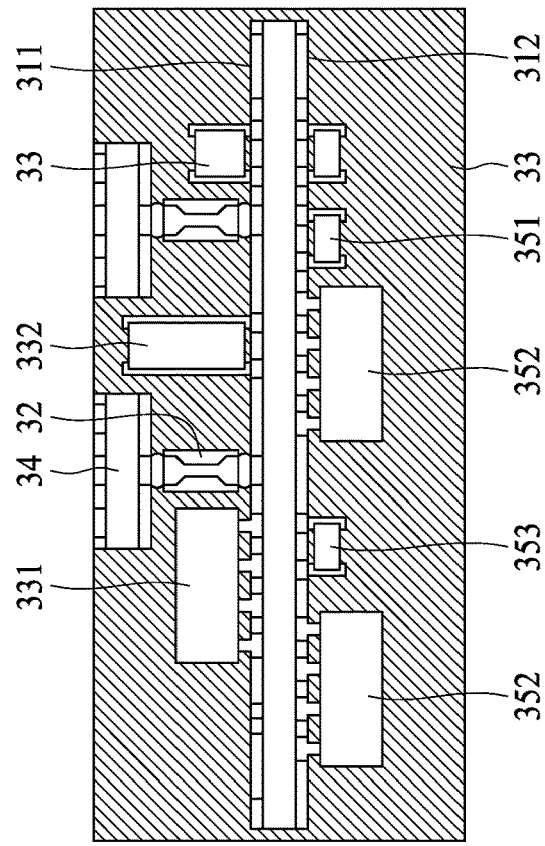

Referring to FIG. 3H, the surfaces 342 of the second interposers 34 are exposed. Further, since the surfaces 342 of the upper interposers 34 may be partially sunk into the tape 37 when the tape 37 is attached to the surfaces 342, the surface 342 of the upper interposer 34 may be higher than a portion of the surface 338 of the encapsulating material 33 which is adjacent to the surface 342 of the upper interposer 34. In addition, as shown in the FIG. 3H, the lateral surfaces of the carriers 31 are encapsulated by the encapsulating material 33. In another embodiment, at least one of the lateral surfaces of one of the carriers may be exposed from encapsulating material 33.

FIG. 4A, FIG. 4B, FIG. 4C, FIG. 4D, FIG. 4E, FIG. 4F and FIG. 4G show a method of manufacturing a semiconductor device package 4 in accordance with another embodiment of the instant disclosure.

Figure 4A:
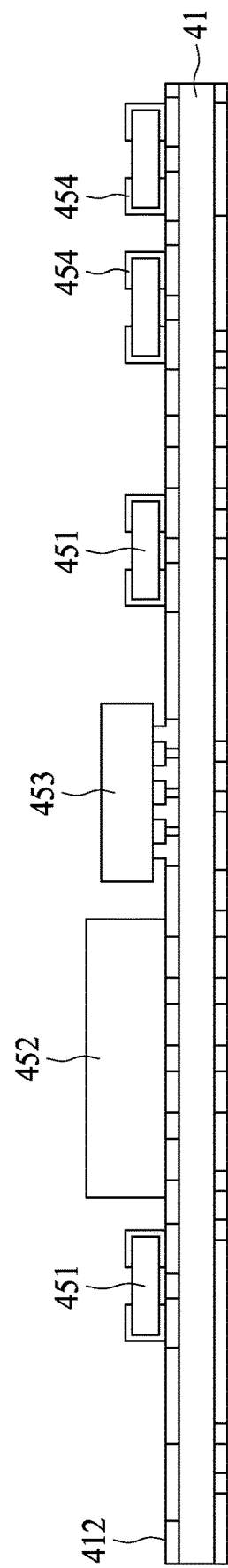
FIG. 4A, FIG. 4B, FIG. 4C, FIG. 4D, FIG. 4E, FIG. 4F and FIG. 4G show a method of manufacturing a semiconductor device package in accordance with another embodiment of the instant disclosure.

Referring to FIG. 4A, the components 451, 452, 453 and 454 may be disposed on the surface 412 of the carrier 41. Especially, the components 451, 452 and 453 may be mounted to the carrier 41 by SMT (Surface Mount Technology) process.

Figure 4B:
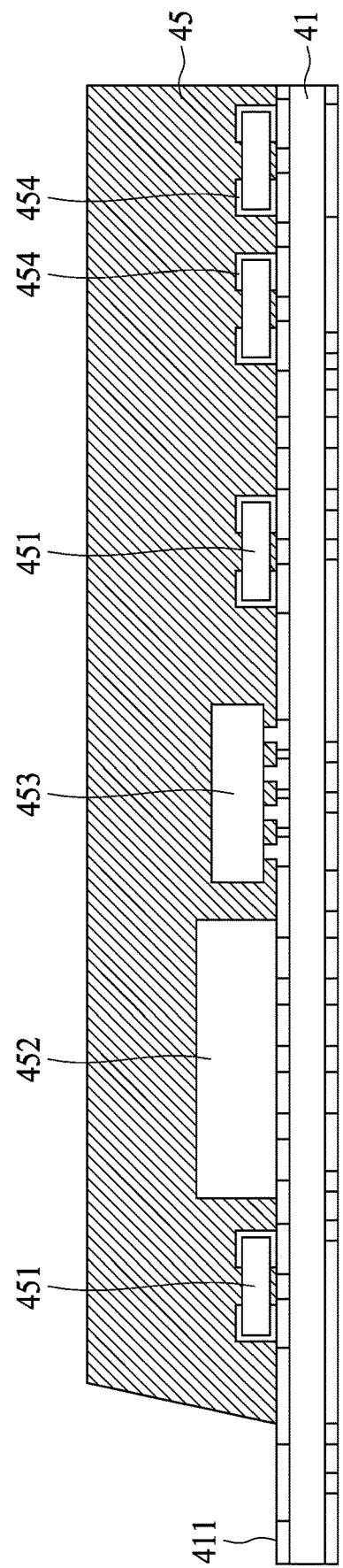

Referring to FIG. 4B, an encapsulating material 45 may be formed on the surface 412 of the carrier 41 and may cover the surface 412 of the carrier 41 and the components 451, 452, 453 and 454.

Figure 4C:
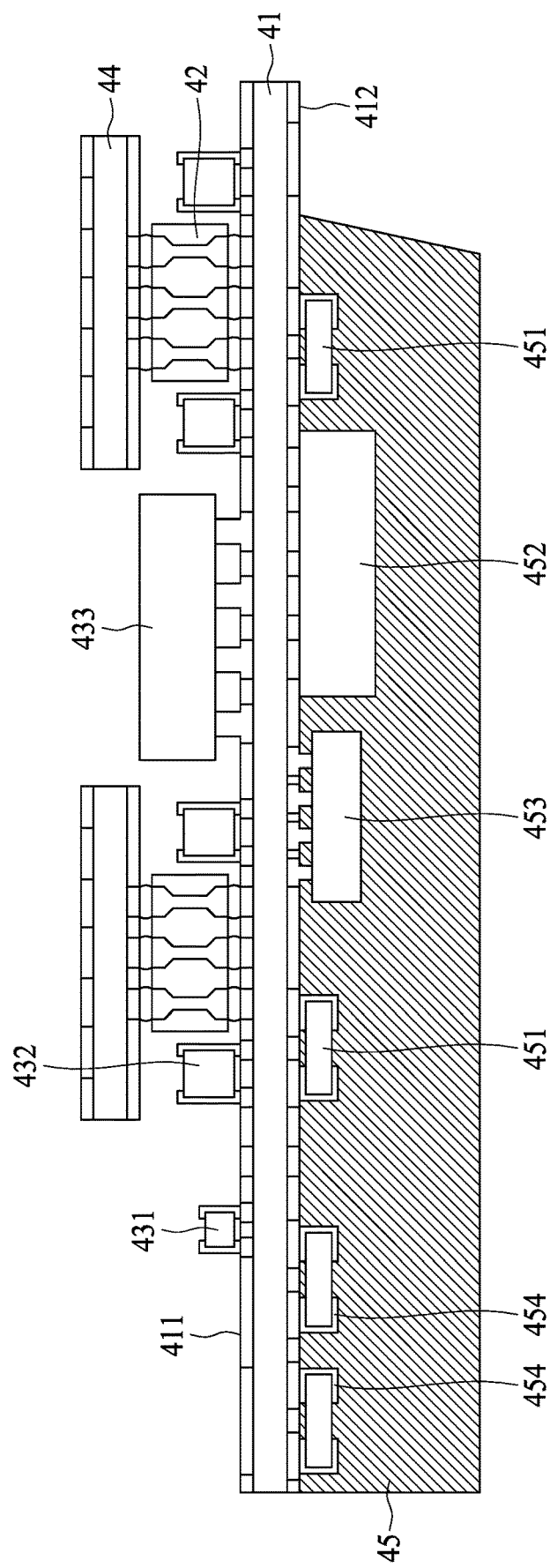

Referring to FIG. 4C, the carrier 41 may be turned upside down. Then, the components 431, 432 and 433 may be disposed on the surface 411 of the carrier 41. Further, the upper interposers 44 may be respectively stacked on the lower interposer 42 and the lower interposers 42 may be disposed on the surface 411 of the carrier 41. Especially, the components 431, 432 and 433 and the lower interposer 42 may be mounted to the carrier 41 by SMT process. Further, as shown in FIG. 4C, one upper interposer 44 may be selectively stacked on a single one lower interposer 42, and a cross-sectional width of the upper interposer 44 may be greater than a cross-sectional width of the lower interposer 42. Thus, the combination of the lower interposer 42 and the upper interposer 44 may be substantially T-shaped. In addition, the components 432 are arranged underneath the upper interposer 44. Moreover, the cross-sectional width of the upper interposer 44 may be smaller than the cross-sectional width of the carrier 41.

Figure 4D:
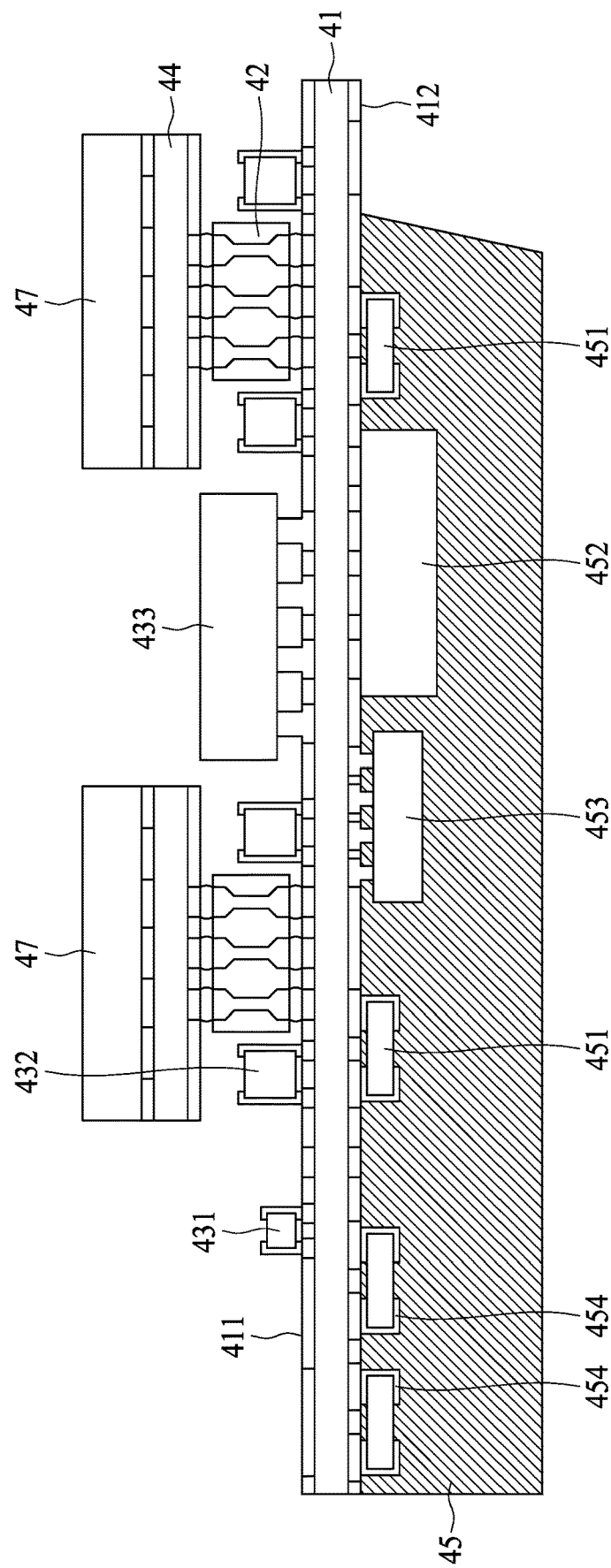

Referring to FIG. 4D, a glue 47 is dispensed on the surface 442 of the upper interposer 44 so as to form a removable/sacrificial layer.

Figure 4E:
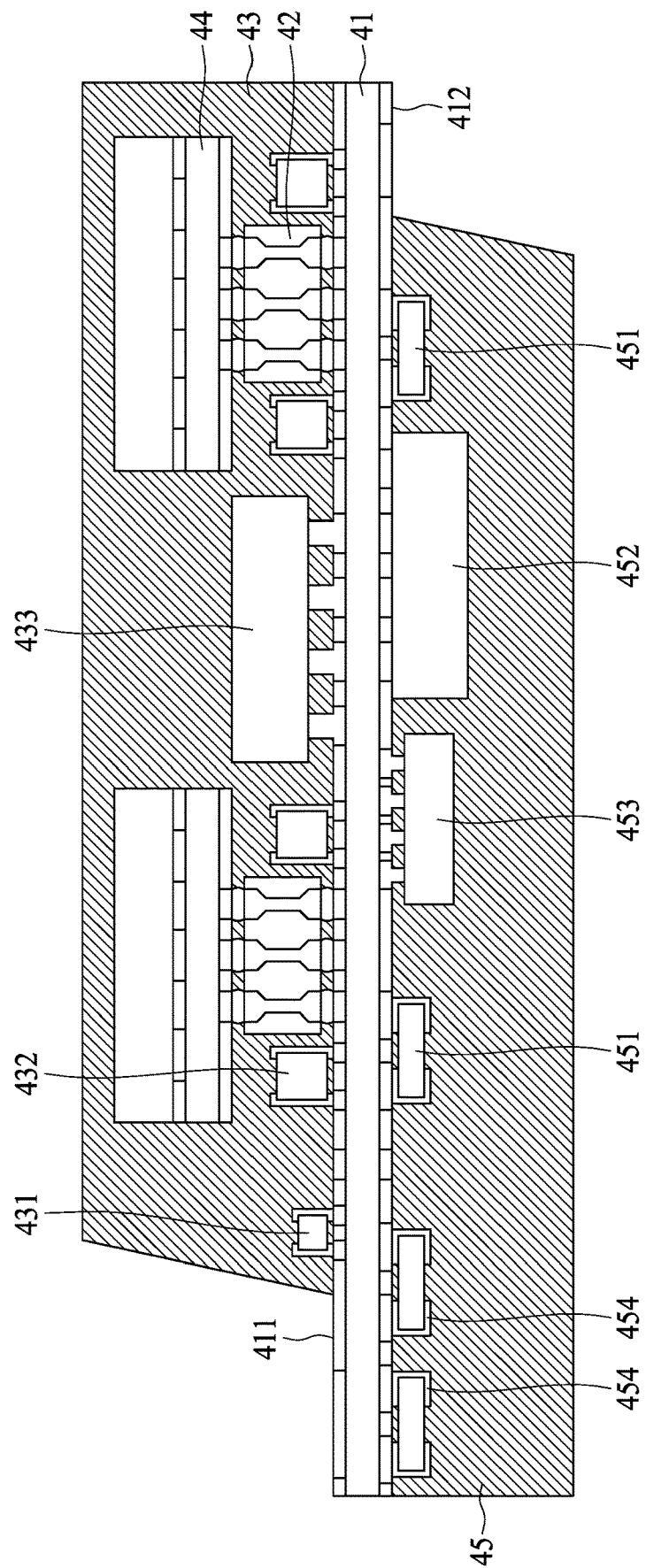

Referring to FIG. 4E, an encapsulating material 43 may be disposed on the surface 411 of the carrier 41 and may cover the surface 411 of the carrier 41, the components 431, 432 and 433, the lower interposers 42, the upper interposers 44 and the glue 47.

Figure 4F:
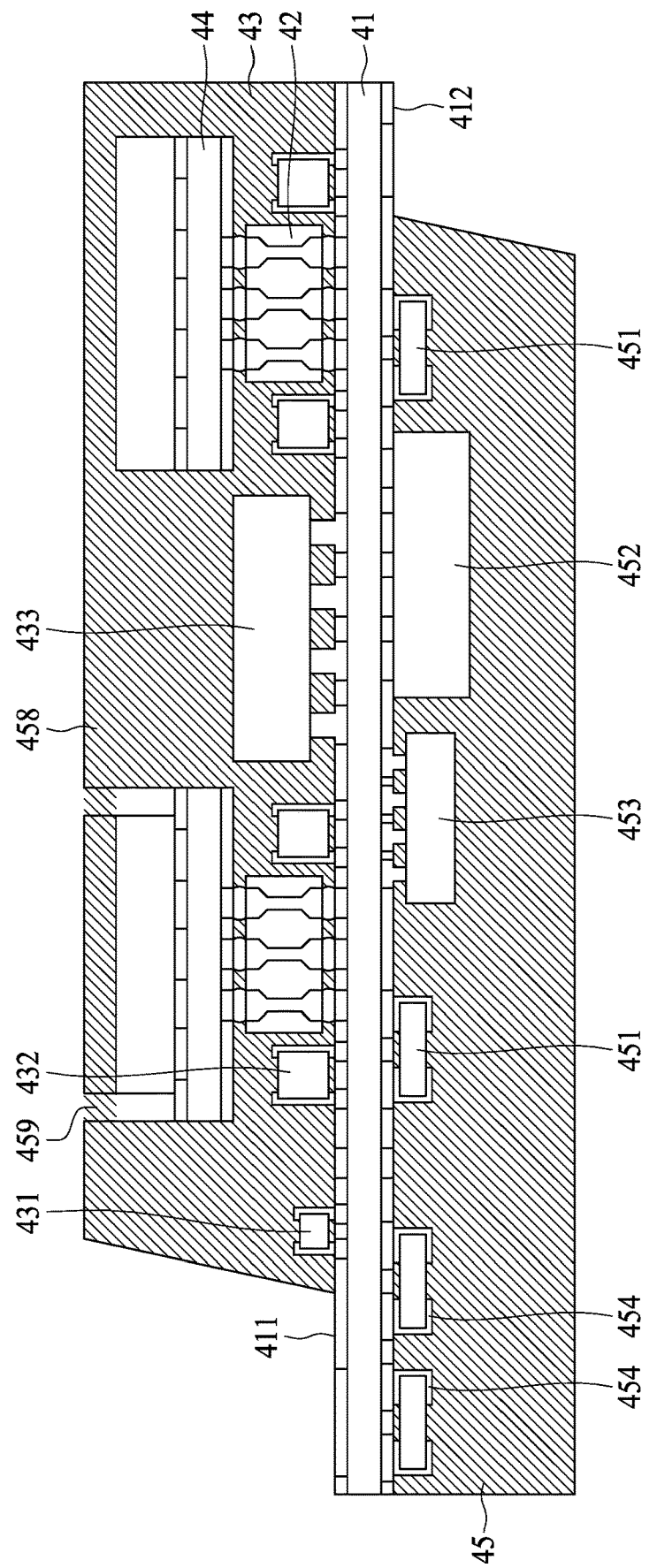

Referring to FIG. 4F, a portion of the encapsulating material 43 is removed by a laser process such that a portion of the glue 47 may be exposed. Since the portion of the encapsulating material 43 is removed by a laser process, the laser trench 439 may be formed at the encapsulating material 43. In particular, the laser trench 439 may extend from the upper surface 438 of the encapsulating material 43 to the glue 47. Thus, a portion of the glue 47 may be exposed.

Figure 4G:
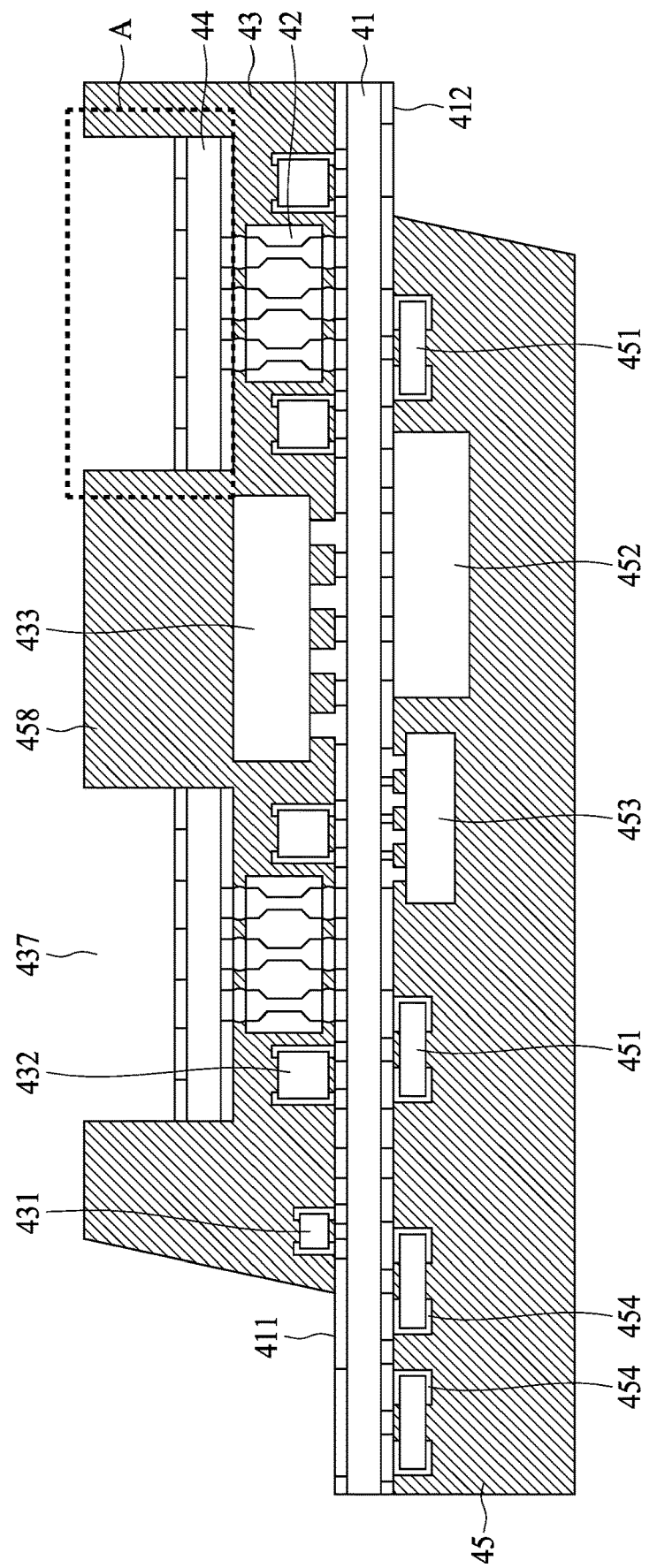

Referring to FIG. 4G, the glue 47 may be removed by physical methods or chemical methods, such as a water washing process. Further, a portion of the encapsulating material 43 attached to the glue 37 is removed too (e.g., is removed while removing the glue 47). After removing the glue 47 and the portion of the encapsulating material 43 attached to the glue 47, the semiconductor device package 4 is formed. In addition, since the portion of the encapsulating material 43 attached to the glue 47 has been removed, the encapsulating material 43 may have cavities 437 on the upper surface 438 of the encapsulating material 43. Further, since the glue 47 has been removed, the surface 442 of the upper interposer 44 and the pads 445 arranged at the upper portion of the upper interposers 44 and adjacent to the surface 442 may be exposed. That is, the surface 442 of the upper interposer 44 and the pads 445 may be exposed and arranged within the cavities 47.

Figure 4H:
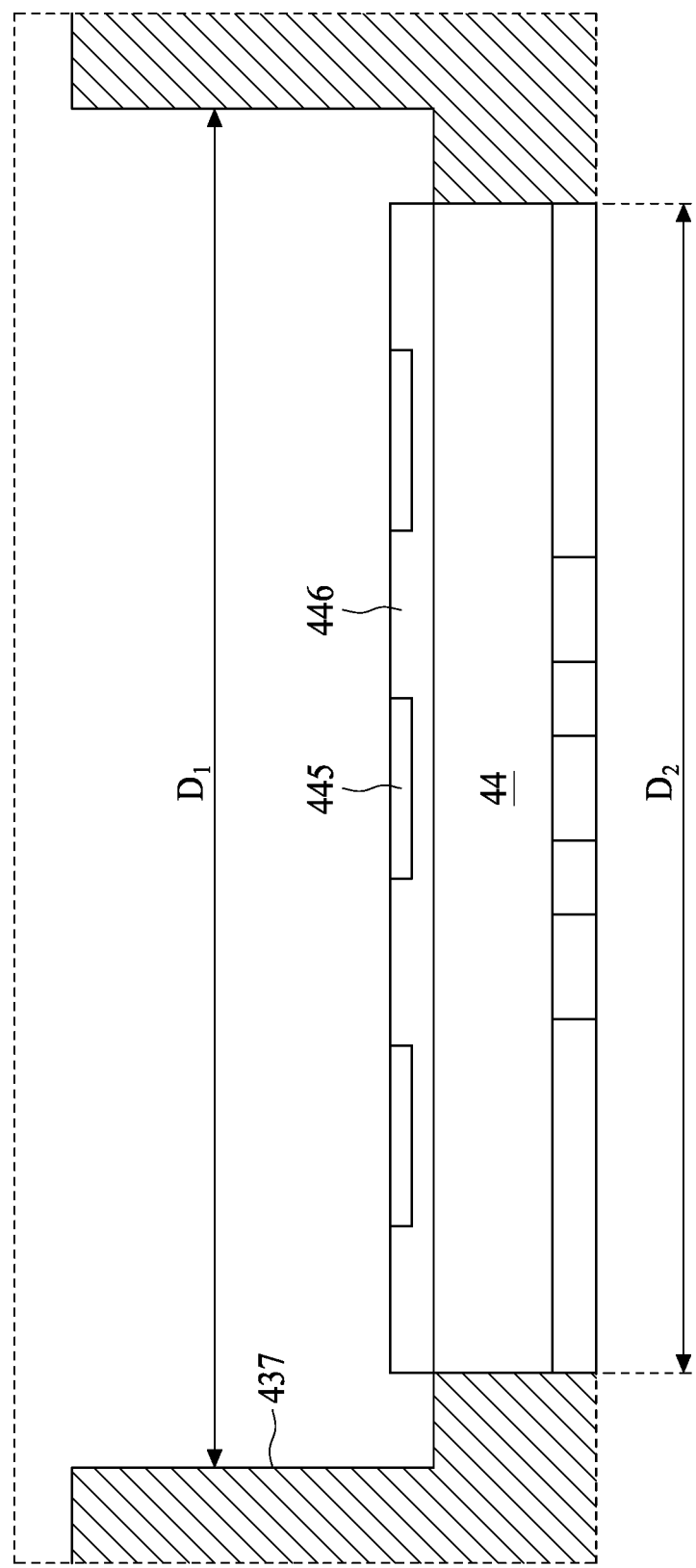
FIG. 4H is an enlarged view of portion "A" illustrated in FIG. 4G.

FIG. 4H is an enlarged view of portion "A" illustrated in FIG. 4G. As shown in FIG. 4H, the distance D1 between two opposite side surfaces of the cavity 437 may be greater than the distance D2 between two opposite lateral surfaces of the upper interposer 44. Referring to FIG. 4F, a portion of the encapsulating material 43 is removed by a laser process. In order to that the overall area of the surface 442 of the upper interposer 44 could be exposed after removing the glue 47 and the portion of the encapsulating material 43 attached to the glue 47, the laser trench 339 may be formed to be adjacent to the outer peripheral of the upper interposer 44. Thus, after the glue 47 and the portion of the encapsulating material 43 attached to the glue 47 are removed and the cavity 437 is formed, the distance D1 between two opposite side surfaces of the cavity 437 may be greater than the distance D2 between two opposite lateral surfaces of the upper interposer 44.

In addition, the upper interposer 44 may have an insulating layer 446 at its upper portion. Moreover, the upper interposer 44 may also have a plurality of pads 445 at its upper portion and these pads 445 may be exposed.

FIG. 5A, FIG. 5B, FIG. 5C and FIG. 5D show a method of manufacturing a semiconductor device package 5 in accordance with another embodiment of the instant disclosure.

Figure 5A:
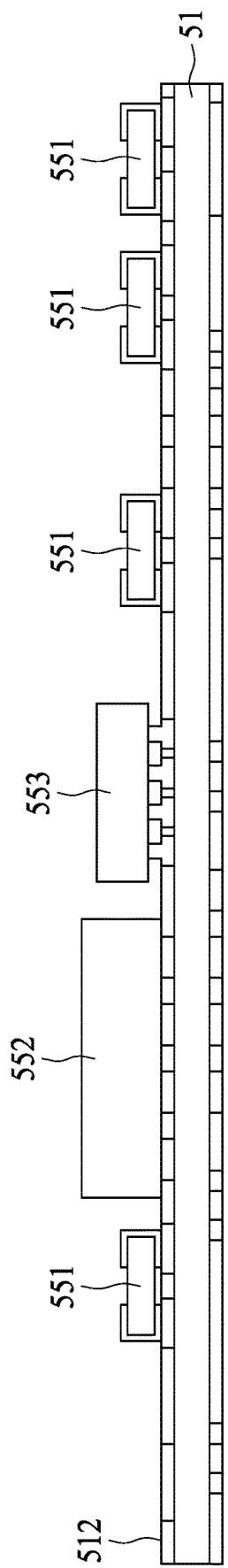
FIG. 5A, FIG. 5B, FIG. 5C and FIG. 5D show a method of manufacturing a semiconductor device package in accordance with another embodiment of the instant disclosure.

Referring to FIG. 5A, the components 551, 552 and 553 may be disposed on the surface 512 of the carrier 51. Especially, the components 551, 552 and 553 may be mounted to the carrier 51 by SMT (Surface Mount Technology) process.

Figure 5B:
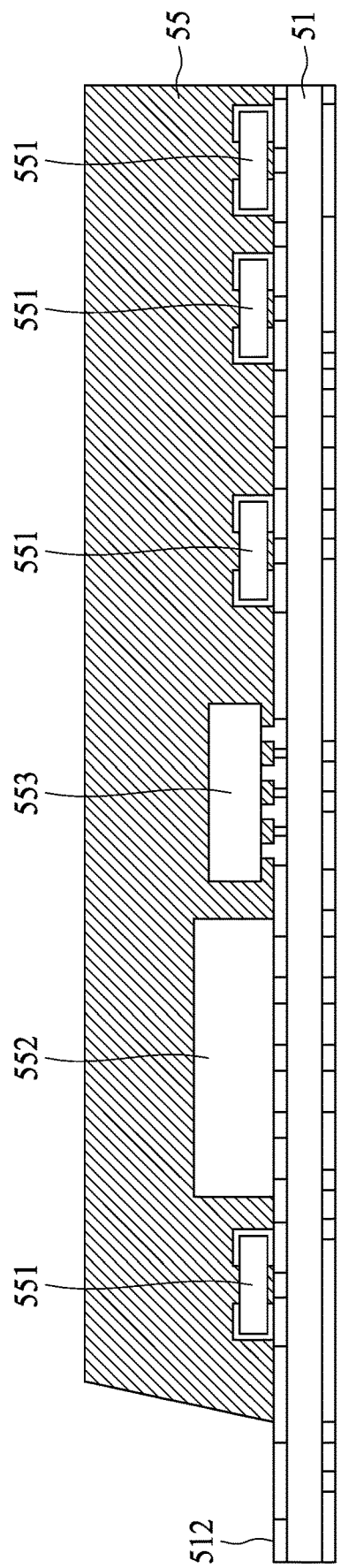

Referring to FIG. 5B, an encapsulating material 55 may be formed on the surface 512 of the carrier 51 and may cover the surface 512 of the carrier 51 and the components 551, 552, 553.

Figure 5C:
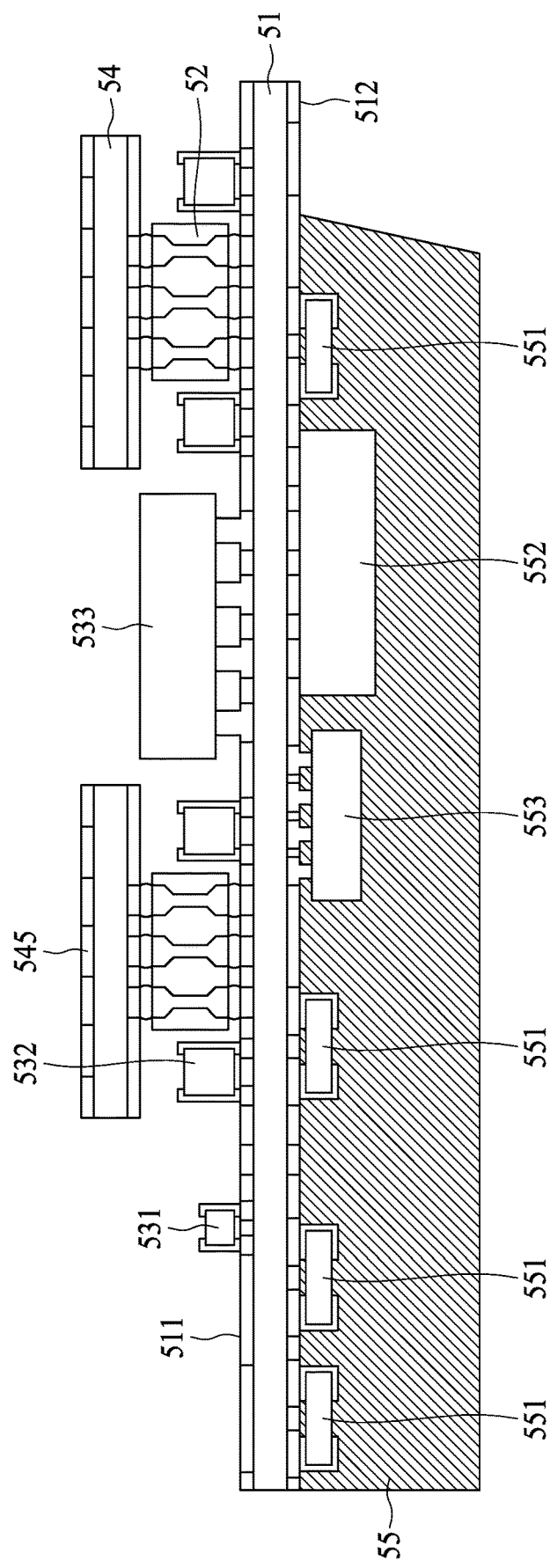

Referring to FIG. 5C, the carrier 51 may be turned upside down. Then, the components 531, 532 and 533 may be disposed on the surface 511 of the carrier 51. The upper interposers 54 may be respectively staked on the lower interposers 52 and the lower interposers are disposed on the surface 511 of the carrier 51. Especially, the components 531, 532 and 533 and the lower interposer 52 may be mounted to the carrier 51 by SMT process. Further, as shown in FIG. 5C, one upper interposer 54 may be selectively stacked on a single one lower interposer 52, and a cross-sectional width of the upper interposer 54 may be greater than a cross-sectional width of the lower interposer 52. Thus, the combination of the lower interposer 52 and the upper interposer 54 may be substantially T-shaped. In addition, the components 532 are arranged underneath the upper interposer 54. Moreover, the cross-sectional width of the upper interposer 54 may be smaller than the cross-sectional width of the carrier 51.

Figure 5D:
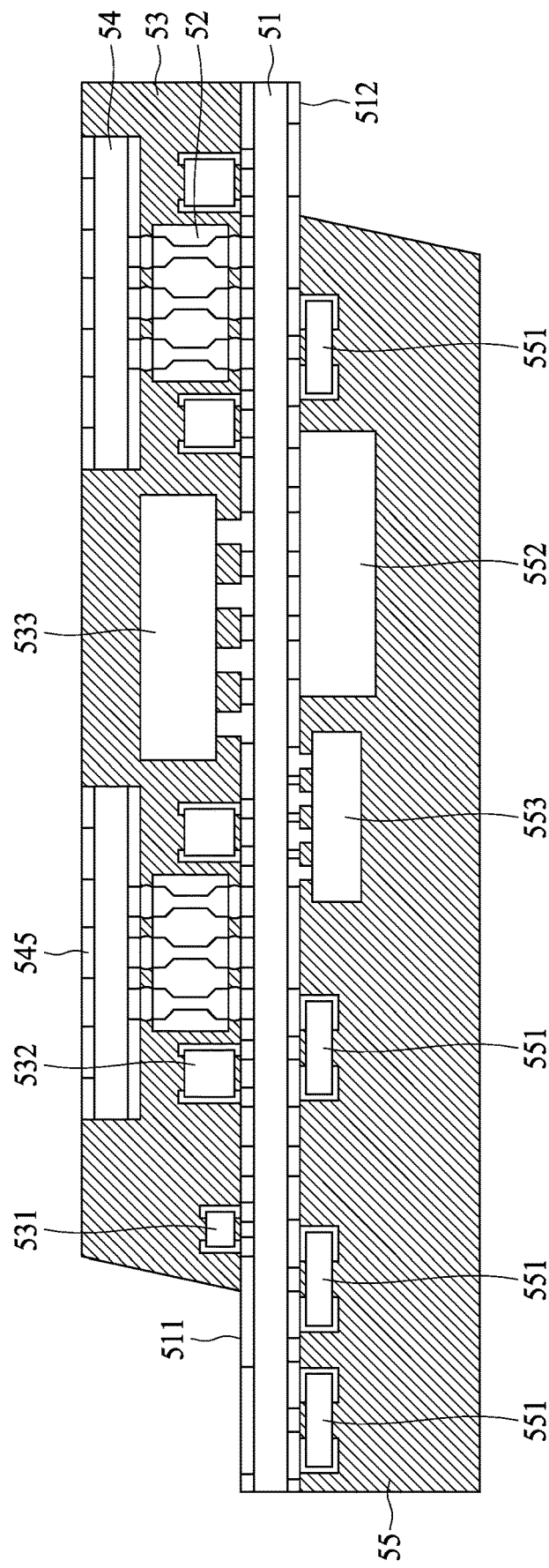

Referring to FIG. 5D, an encapsulating material 53 may be disposed on the surface 511 of the carrier 51 and may cover the surface 511 of the carrier 51, the components 531, 532, 533, the lower interposers 52 and the lateral surfaces of the upper interposers 54. Especially, the encapsulating material 53 may be formed by film molding process. Thereby, the semiconductor device package 5 is formed.

As shown in FIG. 5D, the upper interposer 54 may have a plurality of pads 545 at its upper portion. That is, the pads 545 may be adjacent to the upper surface 542 of the upper interposer 54 and may be exposed.

FIG. 6A, FIG. 6B, FIG. 6C, FIG. 6D, FIG. 6E, FIG. 6F and FIG. 6G show a method of manufacturing a semiconductor device package 6 in accordance with another embodiment of the instant disclosure.

Referring to FIG. 6A, the components 651, 652, 653 and 654 may be disposed on the surface 612 of the carrier 61. Especially, the components 651, 652, 653 and 654 may be mounted to the carrier 61 by SMT (Surface Mount Technology) process.

Figure 6B:
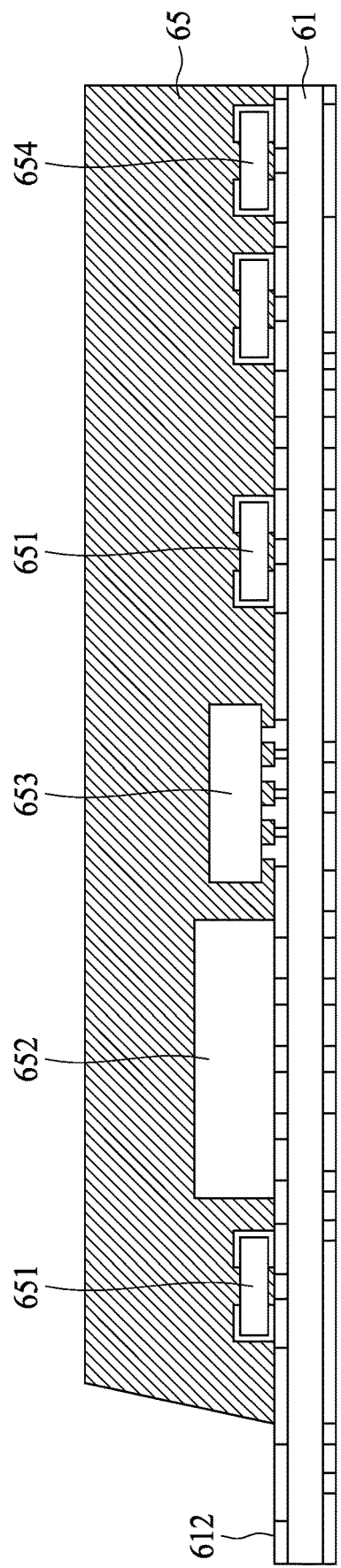

Referring to FIG. 6B, an encapsulating material 65 may be disposed on the surface 612 of the carrier 61 and may cover the surface 612 of the carrier 61 and the components 651, 652, 653 and 654.

Figure 6C:
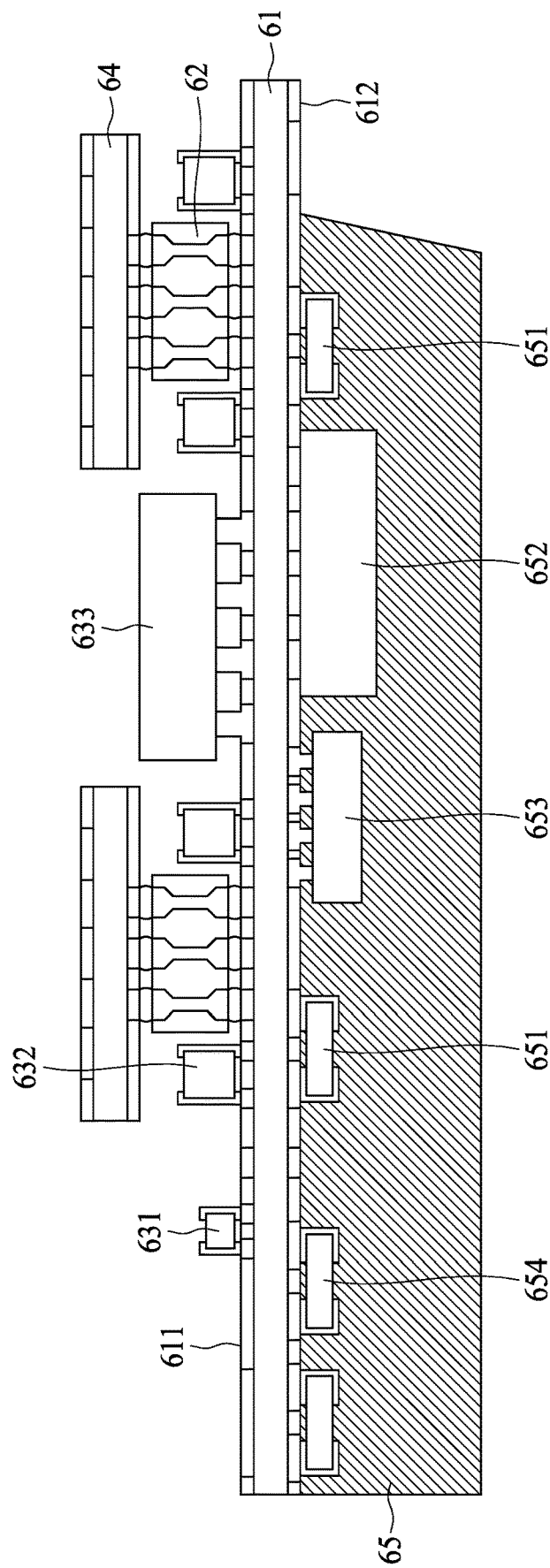

Referring to FIG. 6C, the carrier 61 may be turned upside down. Then, the components 631, 632 and 633 may be disposed on the surface 611 of the carrier 61. The upper interposers 64 may be respectively stacked on the lower interposers 62 and the lower interposers may be disposed in the surface 611 of the carrier 61. Especially, the components 631, 632 and 633 and the lower interposer 62 may be mounted to the carrier 61 by SMT process. Further, as shown in FIG. 5C, one upper interposer 64 may be selectively stacked on a single one lower interposer 62, and a cross-sectional width of the upper interposer 64 may be greater than a cross-sectional width of the lower interposer 62. Thus, the combination of the lower interposer 62 and the upper interposer 64 may be substantially T-shaped. In addition, the components 632 are arranged underneath the upper interposer 64. Moreover, the cross-sectional width of the upper interposer 64 may be smaller than the cross-sectional width of the carrier 61.

Figure 6D:
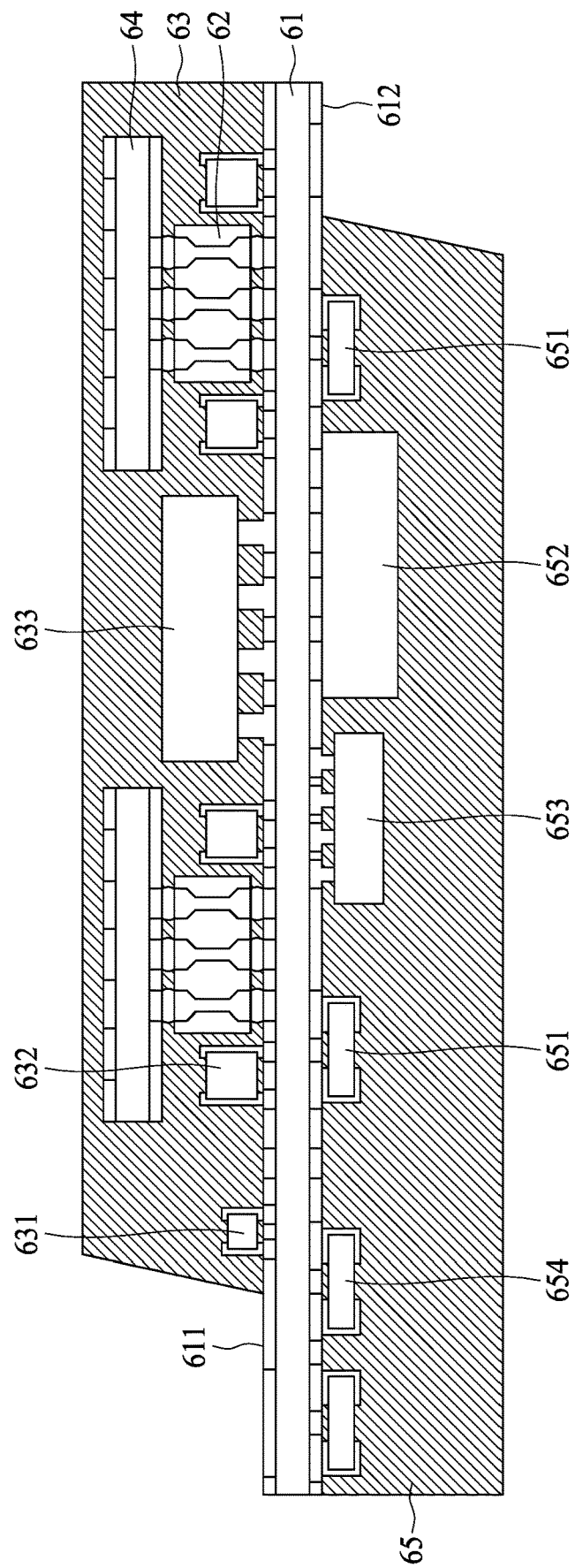

Referring to FIG. 6D, an encapsulating material 63 may be disposed on the surface 611 of the carrier 61 and may cover the surface 611 of the carrier 61, the components 631, 632, 633, the lower interposers 62 and the upper interposers 64. The upper interposer 64 may have a plurality of pads 645 at its upper portion. That is, the pads 645 may be adjacent to the upper surface 642 of the upper interposer 64. The encapsulating material 63 may cover the pads 645 and the upper surface 642 of the upper interposer 64 as well.

Figure 6E:
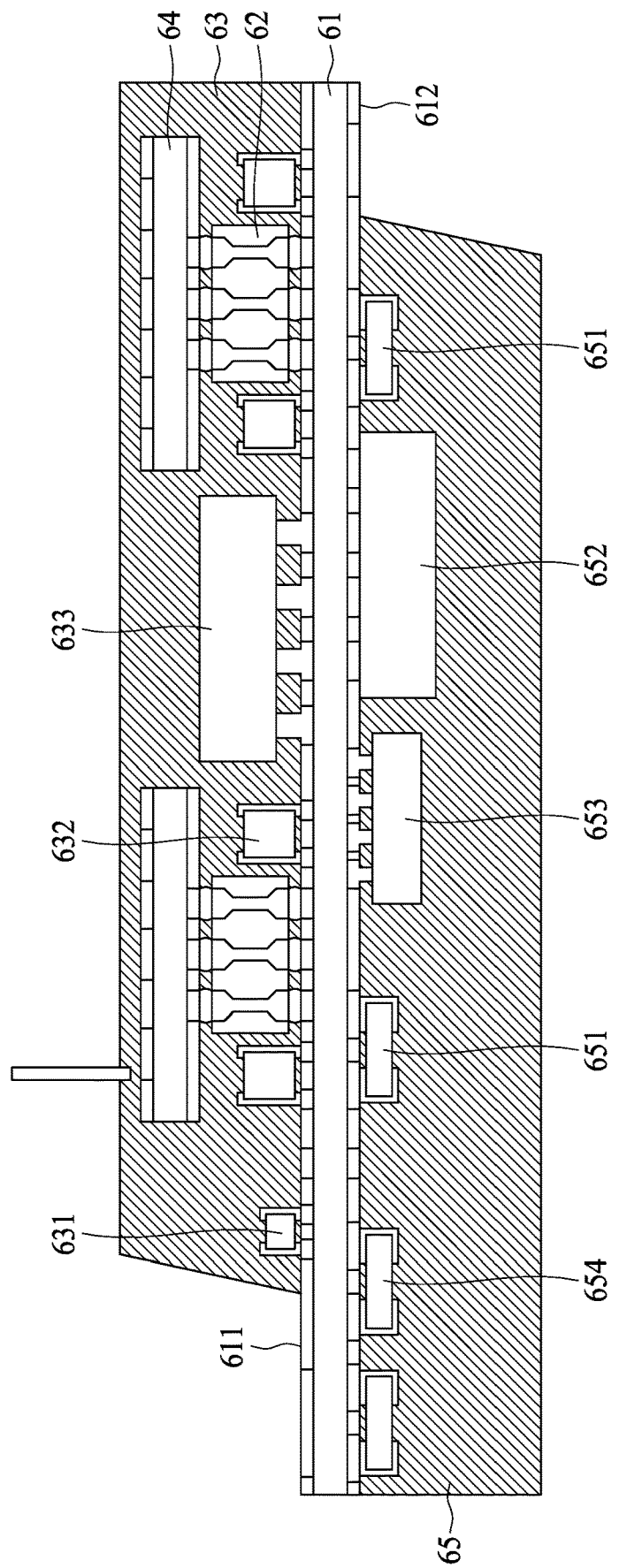
Figure 6F:
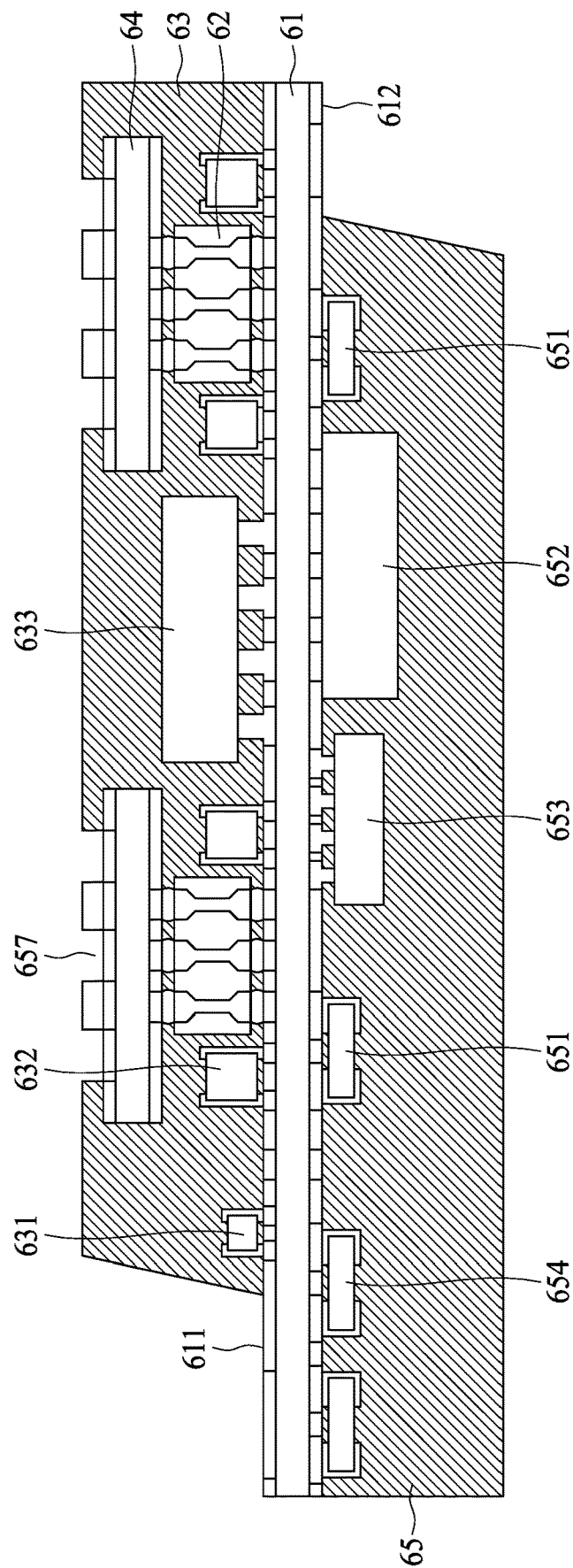

Referring to FIG. 6E, portions of the encapsulating material 63 are removed by the laser drilling. After removing the portions of the encapsulating material 63, the encapsulating material 63 may have cavities 637 and the pads 645 may be exposed (as shown in FIG. 6F).

Figure 6G:
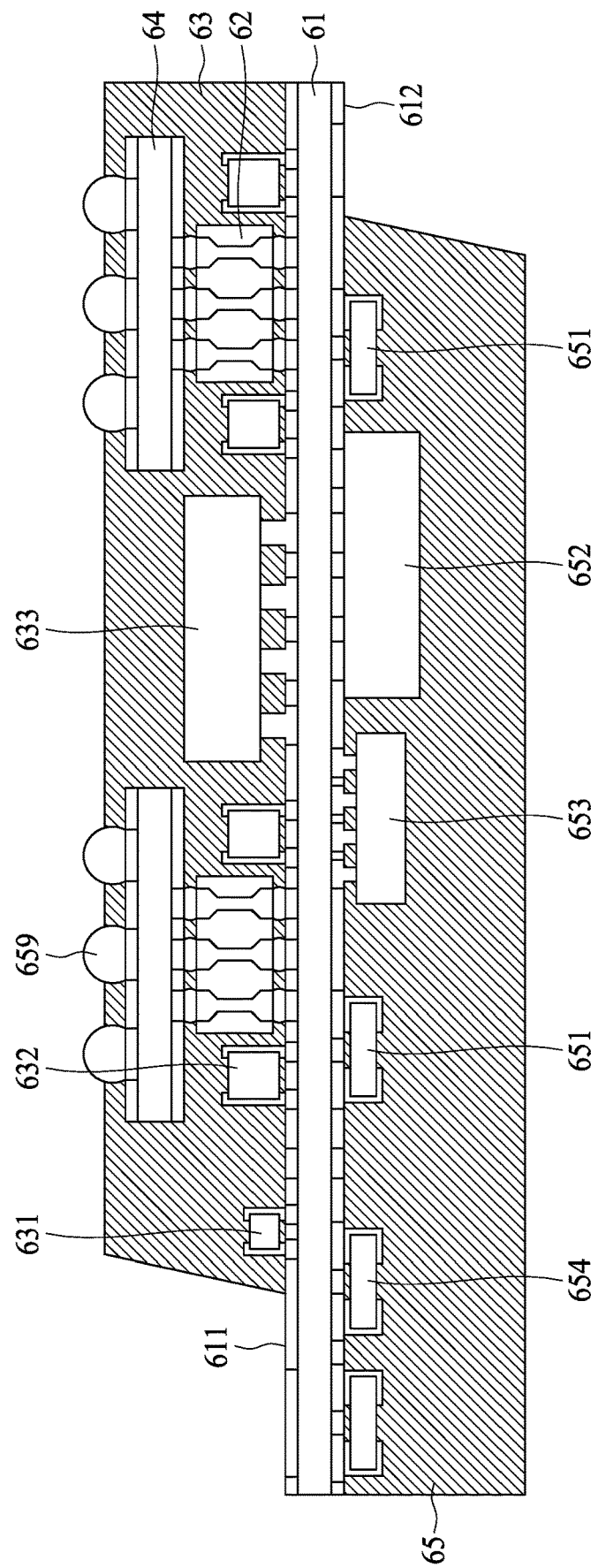

Referring to FIG. 6G, the conductive layer 639 may be arranged within the cavities 637 and formed on the pads 645. Thereby, the semiconductor device package 6 is formed.

Reference to the formation or positioning of a first feature over or on a second feature in the instant disclosure may include embodiments in which the first and second features are formed or disposed in direct contact, and may also include embodiments in which additional features may be formed or disposed between the first and second features, such that the first and second features may not be in direct contact.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

For example, substantially parallel can refer to a range of angular variation relative to 0° of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, substantially perpendicular can refer to a range of angular variation relative to 90° of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the instant disclosure has been described and illustrated with reference to specific embodiments thereof, these descriptions and illustrations are not limiting. It should be understood by those skilled in the art that various changes may be made and equivalents may be substituted without departing from the true spirit and scope of the instant disclosure as defined by the appended claims. The illustrations may not be necessarily drawn to scale. There may be distinctions between the artistic renditions in the instant disclosure and the actual apparatus due to manufacturing processes and tolerances. There may be other embodiments of the instant disclosure which are not specifically illustrated. The specification and drawings are to be regarded as illustrative rather than restrictive. Modifications may be made to adapt a particular situation, material, composition of matter, method, or process to the objective, spirit and scope of the instant disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the instant disclosure. Accordingly, unless specifically indicated herein, the order and grouping of the operations are not limitations of the instant disclosure.

What is claimed is:

1. An electronic device, comprising:
   a carrier;
   an interposer on the carrier and configured to electrically connect an external component to the carrier; and
   a first encapsulant on the carrier and configured to support the interposer,
   wherein the carrier has a first surface and a second surface opposite to the first surface, and wherein the first encapsulant is disposed on the first surface of the carrier and a second encapsulant is disposed on the second surface of the carrier,
   wherein a portion of the second surface of the carrier is free from being covered by the second encapsulant,
   wherein the interposer at least partially overlaps the portion of the second surface of the carrier.

2. An electronic device, comprising:
   a carrier;
   an interposer on the carrier and configured to electrically connect an external component to the carrier; and
   a first encapsulant on the carrier and configured to support the interposer,
   wherein the first encapsulant at least partially exposes two lateral surfaces of the interposer.

3. The electronic device of claim 2, wherein the interposer has a top surface facing away from the carrier and the first encapsulant has an upper surface adjacent to and recessed with respect to the top surface of the interposer.

4. An electronic device, comprising:
   a carrier;
   an interposer on the carrier and configured to electrically connect an external component to the carrier; and
   a first encapsulant on the carrier and configured to support the interposer,
   wherein the first encapsulant exposes a surface of the interposer, and wherein the surface of the interposer faces away from the carrier.

5. The electronic device of claim 4, further comprising a conductive element arranged between the interposer and the carrier and configured to support the interposer.

6. An electronic device, comprising:
   a carrier having a first surface and a second surface opposite to the first surface;
   a first interposer adjacent to the first surface of the carrier and configured to electrically connect an external component to the carrier;
   a first encapsulant adjacent to the second surface of the carrier and exposing a portion of the second surface of the carrier;
   a second component disposed on the first surface of the carrier, wherein the second component is at least partially covered by the first interposer; and;
   a second interposer between the first interposer and the carrier, wherein a height of the second interposer is greater than a height of the third component.

7. The electronic device of claim 6, further comprising a first component disposed on the first surface of the carrier, wherein the first component is configured to electrically connect the first interposer through the carrier.

8. The electronic device of claim 6, further comprising a second encapsulant disposed on the first surface of the carrier and covering the first interposer, wherein a portion of the first surface of the carrier is free from being covered by the second encapsulant.

9. The electronic device of claim 8, wherein a portion of the first interposer is free from being covered by the second encapsulant, and wherein the portion of the first interposer is configured to connect the external component.

* * * * *